United States Patent [19]

Patel et al.

[11] Patent Number: 5,420,000
[45] Date of Patent: May 30, 1995

[54] HEAT FIXABLE HIGH ENERGY RADIATION IMAGING FILM

[75] Inventors: Gordhanbhai N. Patel, Somerset; Yao-Ming Cheng, East Brunswick; Subhash H. Patel, Hoboken, all of N.J.

[73] Assignee: JP Laboratories, Inc., Middlesex, N.J.

[21] Appl. No.: 106,131

[22] Filed: Aug. 12, 1993

Related U.S. Application Data

[63] Continuation-in-part of Ser. No. 970,986, Nov. 2, 1992, abandoned, which is a continuation of Ser. No. 506,272, Apr. 9, 1990, abandoned, which is a continuation-in-part of Ser. No. 973,192, Nov. 2, 1992, abandoned, which is a continuation-in-part of Ser. No. 506,273, Apr. 9, 1990, abandoned.

[51] Int. Cl.$^6$ ............................................. G03C 1/73
[52] U.S. Cl. ............................... 430/332; 430/270; 430/386; 430/374; 430/495; 430/541; 250/390.03; 436/58; 376/158; 376/190
[58] Field of Search ............... 430/270, 386, 332, 374, 430/495, 541; 250/390.03; 436/58; 376/158, 190

[56] References Cited

U.S. PATENT DOCUMENTS

| | | | |
|---|---|---|---|
| 3,064,931 | 12/1962 | Bloom et al. | 430/336 |
| 3,332,916 | 7/1967 | Hay | 260/80 |
| 3,501,297 | 3/1970 | Creamens et al. | 430/374 |
| 3,501,302 | 3/1970 | Foltz et al. | 430/332 |
| 3,501,303 | 3/1970 | Foltz et al. | 430/332 |
| 3,501,308 | 3/1970 | Adelman et al. | 430/332 |
| 3,679,738 | 7/1972 | Creamens et al. | 430/374 |
| 3,703,536 | 11/1972 | Piasek | 260/462 R |
| 3,723,121 | 3/1973 | Hauser | 430/20 |
| 3,743,505 | 7/1973 | Bloom et al. | 430/20 |
| 3,772,011 | 11/1973 | Guevara et al. | 430/270 |
| 3,772,027 | 11/1973 | Luckey et al. | 430/495 |
| 3,772,028 | 11/1973 | Fico et al. | 430/495 |
| 3,794,491 | 2/1974 | Borsenberger et al. | 430/31 |
| 3,811,895 | 5/1974 | Ehrlich | 430/495 |
| 3,822,134 | 7/1974 | Rasch | 430/539 |
| 3,836,368 | 9/1974 | Jun et al. | 430/270 |
| 3,840,369 | 10/1974 | Carlick | 430/285 |
| 3,945,831 | 3/1976 | Satomura | 430/287 |
| 3,999,946 | 12/1976 | Patel et al. | 422/56 |
| 4,066,676 | 1/1978 | Bloom et al. | 260/402.5 |
| 4,189,399 | 2/1980 | Patel | 436/7 |
| 4,228,126 | 10/1980 | Patel | 422/56 |
| 4,235,108 | 11/1980 | Patel | 436/58 |
| 4,238,352 | 12/1980 | Patel | 430/541 |
| 4,276,190 | 6/1981 | Patel | 252/408 |
| 4,381,454 | 4/1983 | Griffith et al. | 250/370.03 |
| 4,384,180 | 5/1983 | Patel | 436/58 |
| 4,384,980 | 12/1983 | Patel | 252/408 |
| 4,581,315 | 4/1986 | Garito | 430/272 |
| 4,734,355 | 3/1988 | Lewis et al. | 430/495 |
| 4,753,830 | 6/1988 | Matsuda | 427/434.3 |
| 4,784,934 | 11/1988 | Lewis et al. | 430/270 |
| 4,788,432 | 11/1988 | Patel | 250/472.1 |
| 4,857,490 | 8/1989 | Johnson | 501/96 |
| 4,895,975 | 1/1990 | Fujiwara | 560/83 |

(List continued on next page.)

FOREIGN PATENT DOCUMENTS 0277984 9/1988 German Dem. Rep. ........... 430/607

OTHER PUBLICATIONS

National Cancer Institute Grant #1 R4 CA 49347-02.

(List continued on next page.)

*Primary Examiner*—Thomas R. Neville
*Attorney, Agent, or Firm*—Frank S. Chow

[57] ABSTRACT

Described is a radiation sensitive imaging film containing a heat fixable radiation sensitive element, e.g., a diacetylene, of the formula: R—C≡C—C≡C—R′, where R and R′ are, e.g., both —CH$_2$—O—CONH—(CH$_2$)$_5$CH$_3$. After exposure to X-radiation during diagnostic or X-ray therapy, the resulting image can be permanently dry fixed by a short heating step and then stored for a long period. Processes for making the film, new binder-convertor systems, and a device incorporating the film are described as well as other imaging, diagnostic and therapeutic methods utilizing the film in high energy radiation applications in the health care field.

26 Claims, 5 Drawing Sheets

U.S. PATENT DOCUMENTS

| | | | |
|---|---|---|---|
| 4,954,543 | 9/1990 | Lewis et al. | 430/495 |
| 4,975,222 | 12/1990 | Yoshino | 252/586 |
| 5,066,576 | 11/1991 | Ichijima | 430/558 |
| 5,069,982 | 12/1991 | Zegarski | 428/690 |
| 5,149,617 | 9/1992 | Liu | 430/346 |
| 5,156,904 | 10/1992 | Rice et al. | 428/219 |
| 5,160,436 | 11/1992 | Hildenbrand et al. | 210/638 |
| 5,173,611 | 12/1992 | Lambert et al. | 250/483.1 |

OTHER PUBLICATIONS

National Cancer Institute Grant #1 R44/CA 49347–03.

Prog. Polym. Sci. vol. 15, 751–823(1990) Titled "Ethyleneimine Polymers" By S. Kobayashi.

J. Poly. Sci. Part A, vol. 28, pp. 741–758(1990) by Y. T. Bao, C. G. Pitt, "Polymeric Amines and their Copper Complexes".

Pure & Applied Chem. vol. 52, pp. 1883–1905 "Preparation and Application of Water Soluble Polymer–Metal Complexes", K. Geckeler et al.

Macromolecules (1987) vol. 20, pp. 1496–1500, S. Kobayashi et al. "Chelating Properties of . . . Polyethyleneimines".

Lim, K. C., Heeger, A.J.–J. Chem. Phys. 82(1), 1 Jan. 1985 pp. 522–530 "Spectroscopic and Light Scattering Studies . . . ".

National Cancer Institute Grant #1 RY CA 49347–01 SBIR.

Advances in Polymer Science, vol. 63, pp. 1–48 (1984) by H. Bassler.

Encyclopedia of Polym. Sci. & Eng. vol. 1–John Wiley–"Alkylenimine Polymers" pp. 680–739 (1988).

HEAT FIXABLE HIGH ENERGY RADIATION IMAGING FILM

ACKNOWLEDGMENT

The major part of this work was supported from Research Grants (R43 CA49347-01, R43 CA49347-02, and R43 CA49347-03) from the National Cancer Institute, U.S. Department of Health and Human Services under the Small Business Innovation Research Program.

CROSS REFERENCE TO RELATED APPLICATIONS

The instant case is a continuation-in-part application of the following U.S. applications: Ser. No. 07/970,986, filed Nov. 2, 1992, now abandoned, which is a continuation application of Ser. No. 07/506,272, filed Apr. 9, 1990, now abandoned; and Ser. No. 07/973,192, filed Nov. 2, 1992, now abandoned, which is a continuation application of Ser. No. 07/506,273, filed Apr. 9, 1990, now abandoned.

BACKGROUND OF THE INVENTION

1. Field of the Invention

This invention relates to a radiation sensitive film for imaging and monitoring high energy ultraviolet, electrons, X-rays, and neutrons utilizing as the radiation sensitive element; a radiation polymerizable diacetylenic composition, which can be fixed during processing simply by heating after exposure. The invention also relates to convertor-complexed polymeric binder compositions useful in the film for converting high energy incident radiation into lower energy radiation to enhance image formation. Processes for preparing emulsions of radiation sensitive compounds for use in the film are also provided.

2. Brief Description of Prior Art

High energy radiation, including that having energy higher than 4 eV, such as short wavelength UV light, X-rays, gamma rays, electrons, neutrons, and laser radiation are used for a variety of applications, such as curing of coatings and cross linking of polymers, recording images and information, radiography, nondestructive testing and diagnostic and radiation therapy.

Currently, silver halide film, composed mainly of an emulsion of silver bromide/iodide in gelatin is widely used as the film for recording images and information, diagnostic and industrial radiography and monitoring radiation therapy and dose. The main advantages of silver halide film are (1) high spatial resolution, (2) image distribution across a plane which can be obtained from a single exposure and (3) information can be stored permanently. However, silver halide film has many disadvantages and drawbacks: (a) it requires protection from ambient light until fixed, (b) the developing and fixing processes are "wet" and chemical based, and require about five minutes developing time, and the concentrations of individual solutions and chemicals, time and temperature of developing and fixing must be strictly controlled. However, it is desired in the art to have a self-developing, fast, dry fixing film which is not affected by white light. There is further a definite need for an inexpensive, dry-processing film for monitoring high energy radiation dosages, storing information and images, nondestructive testing of industrial parts, medical diagnosis, quality control and verification of radiation therapy procedures which has the advantages and desired features of silver halide film with essentially none of its major disadvantages and drawbacks.

New photosensitive materials are constantly being searched for to provide new film devices. One such group of materials being evaluated are the polymerizable diacetylenes, R—C≡C—C≡C—R, where R is a substituent group, which diacetylenes polymerize in the solid state either upon thermal annealing or exposure to high energy radiation [Adv. Polym. Sci., 63,1 (1984)]. The term diacetylene(s) is used herein to designate a class of compounds having at least one —C≡C—C≡C— functionality. The solid monomers are colorless or white, the partially polymerized diacetylenes are blue or red, while the polydiacetylenes are metallic being usually a copper or gold color. Polydiacetylenes are highly colored because the "pi" electrons of the conjugated backbone are delocalized. The color intensity of the partially polymerized diacetylenes is proportional to the polymer conversion.

A number of patents have been issued on the synthesis and use of conjugated polyacetylenic compositions. as radiation dosimeters, temperature monitors, and time temperature indicators.

The use of diacetylenes including those having carboxylic acid substituents and their derivatives in photographic and other related arts is disclosed in several U.S. Patents, such as, U.S. Pat. Nos. 3,501,297 and 3,679,738 (issued to Cremeans), U.S. Pat. No. 3,501,302 (issued to Foltz), U.S. Pat. No. 3,501,303 (issued to Foltz et al), U.S. Pat. No. 3,501,308 (issued to Adelman) and U.S. Pat. Nos. 3,743,505; 3,844,791 & 4,066,676 (all three issued to Bloom). These patents disclose dispersions in resin, gelatin, or gum matrices of certain diacetylene crystals for directly imaging photo-reactive compositions. Light exposed areas are evidenced by a color change. A quantum efficiency of 8 to 16 is reported. For the use of diacetylenes in diagnostic X-ray film imaging, significantly high quantum yields are required.

Diacetylenes are not sensitive to visible radiation (long wavelength). Luckey and Boer in U.S. Pat. No. 3,772,027 disclose a diacetylenic photosensitive element containing inorganic salts, such as titanium dioxide, zinc oxide, cadmium iodide, and cadmium sulfide as sensitizers to make the element sensitive to visible radiation. Another similar patent (U.S. Pat. No. 3,772,028) issued to Fico and Manthey discloses a photosensitive element sensitized to visible radiation by the addition of pyrylium salts including thiapyrylium and selenapyrylium salts. Amplification of poorly imaged crystalline diacetylenic compositions is obtained in U.S. Pat. No. 3,794,491 (issued to Borsenberger et al). Faint images are enhanced through post-exposure irradiation. These patents describe formulations and processes for making diacetylenes sensitive to longer wavelength (lower energy) radiation, such as visible so that the film can be used as a photographic film for visible light. However, there is no report on the sensitization of diacetylenes to shorter wavelength (higher energy) radiation, such as X-rays. Such sensitization to higher energy radiation is desirable for making, for example, diagnostic X-ray film.

In order to increase the spatial resolution of images obtained with diacetylenic imaging compositions, Rasch in U.S. Pat. No. 3,882,134, prepared compositions having a much finer grain structure than reported before. He described the use of vapor deposition to facilitate the isolation of fine microcrystals.

Ehrlich in U.S. Pat. No. 3,811,895 disclosed the use of organometallics as sensitizers and the use of such sensitized systems as X-ray film media. Lewis, Moskowitz, and Purdy in U.S. Pat. No. 4,734,355 disclose a processless recording film made from crystalline polyacetylenic compounds. They also disclosed a process of dispersing crystalline polyacetylenic compounds in a nonsolvating medium to a concentration of about 2 to 50% polyacetylene crystalline solids and aging said dispersion before drying on a substrate. The sensitivity of the obtained film is low and hence exposure of at least a kilorad of radiation is required to produce the image. Their gelatin/diacetylene mixture requires prolonged aging at low temperature. However, it would be desirable to have a process which does not require aging of the emulsion. Fine crystals (grain size) are desirable for certain applications, such as microfilm and larger crystals can be used for other applications, such as radiation therapy film so that higher radiation sensitivity can be obtained. It is also desirable in the act to have a process to control the diacetylene crystal size.

Guevara and Borsenberger in U.S. Pat. No. 3,772,011 describe print-out elements and methods using photoconductors and crystalline polyacetylenic compounds in contact with a photoconductive layer. Visible images are obtained when these layers are contacted with the application of an electric potential. In the absence of an applied potential, the elements described are stable under normal room-light handling conditions. Guevera et al in U.S. Pat. No. 3,772,011 provides a diacetylenic composition which undergoes direct image-wise photopolymerization to a highly colored polymeric product when elaborated into a layer of micro-crystals contiguous to a photo-conductive layer. Such polymerization takes place upon exposure during the application of an electric potential across the layers. In some cases, an organic photoconductor may be included in the layer of crystalline polyacetylenes.

Use of diacetylenic compositions for photoresists has been disclosed in U.S. Pat. Nos. 3,840,369; 4,581,315 and 3,945,831.

Patel in U.S. Pat. Nos. 4,235,108; 4,189,399; 4,238,352; 4,384,980 has disclosed a process of increasing the rate of polymerization by cocrystallization of diacetylenes. Patel and others in U.S. Pat. Nos. 4,228,126; and 4,276,190 have described an inactive form of diacetylenes for storing and method of rendering them active prior to use by solvent, vapor and/or melt recrystallization.

Mong-Jon Jun at el (U.S. Pat. No. 3,836,368) describe 2,4-hexadiyn-1,6-bis(n-hexyl urethane), referred to here in as "166", which turns red upon short wavelength UV irradiation (See Example 3 in the Patent). They prepared a coating formulation by adding water to a solution of 166 in polyvinylpyrrolidone in methanol. The UV exposed coating was red, and it changed to a black color after heating at 55° C. and became inactive to UV light. Although 166 is sensitive to UV radiation, the reactivity is not sufficient to use it for applications, such as diagnostic X-ray film. There is a need to increase the reactivity of 166 so that images can be obtained at a lower radiation dose. We repeated the process described by Jun et al and prepared a coating of 166 by the process disclosed in U.S. Pat. No. 3,836,368. We obtained undesirably large crystals and hence an opaque coating. Thus, there is a need in the art for a film device which contains heat fixable diacetylenes, is highly radiation sensitive, preferably transparent and which can be quickly heat fixed in a dry process providing high resolution imaging.

None of the above described patents describe a film which is substantially transparent, highly sensitive to short wavelength UV, X-ray, electron, gamma ray, or neutron radiation and contains a radiation sensitive element composed of at least one polymerizable diacetylenic compound and a convertor which emits radiation of wavelength shorter than 350 nm when contacted with high energy radiation, which when heated becomes fixed and turns into a blue permanent image. Further, use of a polymeric binder e.g., polyethyleneimine, complexed with a convertor material is also not reported. Furthermore, there is no report of a process for making an emulsion of a diacetylene which does not require aging and provides the desired micro-size crystals for preparing transparent films. There are further deficiencies in the prior art with respect to the field of radiation sensitive imaging and monitoring devices as described below.

Silver halide film is not very sensitive to diagnostic X-ray radiation. X-ray images are amplified by placing the film between two fluorescence screens. Intensifying screens are luminescent materials and usually consist of a crystalline host material to which is added a trace of an impurity. Luminescence in inorganic solids usually originates at defects in the crystal lattice (Thomas F. Soules and Mary V. Hoffman, Encyclopedia of Science and Technology, Vol. 14, 1987, pp527–545). The phosphor of the fluorescence screen absorbs X-rays and emits white light. Intensifying screens made with calcium tungstate phosphors have been in use since the time of Roentgen. Around 1972, a new phosphor, gadolinium oxysulfide was developed which emits in the green region and film sensitized to absorb green light was developed. About the same time other phosphors, such as barium fluorochloride and lanthanum oxybromide, which emit in the blue region, were developed. A large number of phosphors have been reported in the literature including terbium activated rare earth oxysulfide ($X_2O_2S$ where X is gadolinium, lanthanum, or yttrium) phosphors (T. F. Soules and M. V. Hoffman, Encyclopedia of Chemical Technology, Vol.14, pp 527–545, 1981 and references quoted therein). Gadolinium and tungsten have very high atomic numbers and also have a high energy absorption coefficient. The following combinations have been used for this purpose: GdOS:Tb(lll), LaOS:Tb(lll), LaOBr:Tb(lll), LaOBr:Tm(lll), and Ba(FCl)$_2$:Eu(ll). A number of patents e.g. U.S. Pat. Nos. 5,069,982; 5,173,611; 4,387,141; and 4,205,234 are representative and have been issued. Among the hundreds of phosphors reported, the literature search reveals that most of them are blue-, green-, or long wave-UV emitting phosphors upon excitation by X-ray. Some of them emit long wavelength blue light, for example, U.S. Pat. No. 4,719,033. No one has so far reported an X-ray screen with a short-wave UV emitting (e.g., wavelength shorter than 275 nm) phosphor.

Convertors/phosphors are usually used as a screen in form of a fine powder dispersed in a polymeric binder. The screens are placed in contact with the emulsion of silver halide film during X-ray irradiation. The prior art does not describe a convertor/phosphor which is in the form of a transparent coating being a solid solution or complex of a convertor with a polymeric binder. The use of these convertors in the under coat, radiation sensitive coat and top coat of the device is also not described.

Polymers are widely used as binders for a variety of applications including paints and X-ray film coating. Though other polymers are proposed, gelatin is a widely used binder for silver halide and other photosensitive materials including diacetylenes. Many polymers have the ability to form complexes with inorganic compounds. However, there is no report on the use of polymeric complexes as binders for the radiation sensitive formulations, such as diacetylenes.

Polyethyleneimine, referred herein as PEI, forms complexes with a number of inorganic and organic compounds, see Polym. Sci., Vol. 15, pp 751–823, 1990 by S. Kobayashi and J. Polymer Science: Part A: Polymer Chem., Vol. 28, pp. 741–758 (1990) by Y. T. Bao and C. G. Pitt. However, there is no report on use of polyethyleneimine and its complexes as binders and convertors for radiation sensitive films.

Emulsions are usually prepared by homogenizing-/emulsifying two immiscible liquids, e.g., a water immiscible solvent (e.g., ethylacetate) with water using an emulsifying agent, such as a surfactant. For example, U.S. Pat. No. 4,734,355 describes this type of system, e.g., diacetylene dissolved in water immiscible solvent, such as ethylacetate and emulsified with gelatin solution in water at high speed. As the solvent used is a good solvent for diacetylenes, the method requires that the emulsion be chilled to a low temperature, and the solvent removed and aged. There is no report on making of an emulsion of diacetylenes without a binder and later mixing the emulsion with a binder. Furtiler, there is no report on preparation of emulsion of a radiation sensitive material, such as diacetylene without using a organic solvent. Further, there is no report on quenching the emulsion to a very low temperature, e.g., liquid nitrogen temperature, to freeze the emulsion and inducing crystal growth by thawing the frozen emulsion.

SUMMARY OF THE INVENTION

We have discovered that a self-developing, dry fixing film device for monitoring, recording and imaging with radiation, such as UV light, electrons, X-rays, neutrons, or gamma rays, can be made by the use of at least one heat fixable conjugated diacetylene, a binder, such as polyethyleneimine, complexed with a converter material, capable upon radiation with high energy electrons, x-rays, gamma rays, neutrons, of generating secondary radiation which is capable of inducing polymerization of the heat fixable diacetylene to form a colored image.

Particularly useful is a specific diacetylene (R—C≡C—C≡C—R), 166 where [R=—CH$_2$OCONH(CH$_2$)$_5$CH$_3$] and a few closely related diacetylenes which have several unique properties, such as high radiation reactivity, low thermal reactivity, crystallization to an inactive phase from melt, and thus heat fixable. In addition, 166 undergoes a red-to-blue color change when the partially polymerized 166 is heated near or above its melting point. A preliminary toxicity study indicates that 166 is nontoxic.

We have also discovered that certain other diacetylenes such as 155 [R—C≡C—C≡C—R, where R=—CH$_2$OCONH(CH$_2$)$_4$CH$_3$], 156 [R'—C≡C—C≡C—R", where R'=—CH$_2$OCONH(CH$_2$)$_5$CH$_3$ and R"=—CH$_2$OCONH(CH$_2$)$_4$CH$_3$] and 16PA [R'—C≡C—C—R", where R'=—CH$_2$OCOCH$_2$C$_6$H$_5$ and R'=—CH$_2$OCONH(CH$_2$)$_5$CH$_3$] also have very high radiation reactivity and undergo a phase change, from an active to inactive, when heated near or above their melting points and can be used for making the film.

We have also unexpectedly found that the other related diacetylenes, such as 155, 156 and 16PA which can cocrystallize with 166, can increase the radiation reactivity. Specifically, the 85:15 mixture of 166:156 is a preferred diacetylene mixture for the film. We have also discovered that diacetylenes such as 155, 156 and 16PA each have very high radiation reactivity and transform to an inactive phase upon heating near or above their melting points.

By this invention there is provided a self-developing film for developing an image from exposure to X-ray, gamma ray, electron, or neutron radiation comprising at least one conjugated diacetylene, or cocrystallized mixture thereof, capable of undergoing a color change upon polymerization when contacted with ultraviolet light, X-rays, alpha particles,, or electrons, thereby forming an image; a binder; a convertor, wherein said convertor is a material capable of emitting ultraviolet light, low energy X-rays, alpha particles, or electrons upon contact with higher energy X-ray, gamma ray, electron, or neutron radiation; wherein said image is capable of being fixed by heating said diacetylene at or above its melting point, or at the temperature at which the diacetylene undergoes a phase change to a radiation inactive phase.

Further provided is the above film further comprising: (a) at least one layer containing said at least one conjugated diacetylene, or cocrystallized mixture thereof, capable of undergoing a color change upon polymerization induced by ultraviolet light, X-rays, alpha particles, or electrons, thereby forming a colored image; (b) at least one layer containing said binder and said convertor being in combination, being a complex or solid solution, wherein said convertor is a material capable of emitting ultraviolet light, low energy X-rays, alpha particles, or electrons upon contact with higher energy X-ray, gamma ray, electron, or neutron radiation; (c) a substrate upon which said layers (a) and (b) are deposited thereon, wherein layer (a) and layer (b) are capable of being combined into one layer (ab), and said colored image is capable of being fixed by heating said diacetylene at or above its melting point, or at the temperature at which the diacetylene undergoes a phase change to a radiation inactive phase.

Furthermore, there is also provided: a self-developing film for developing an image from exposure to ultraviolet or laser radiation comprising at least one conjugated diacetylene, or cocrystallized mixture thereof, capable of undergoing a color change upon polymerization when contacted with ultraviolet or laser radiation, thereby forming an image, and a binder, forming a transparent film, wherein said image is capable of being fixed by heating said diacetylene at or above its melting point, or at the temperature at which the diacetylene undergoes a phase change to a radiation inactive phase.

We have also discovered a process for synthesis of a co-crystallized mixture of two or more diacetylenes in a single step, preferably in one pot. Specifically, the 85:15 mixture of 166:156 can be prepared by first reacting 7.5 mole percent of n-pentyl isocyanate with 2,4-hexadiyn-1,6-diol and then adding 92.5 mole percent of n-hexylisocyanate.

By this invention there is further provided a process for producing an asymmetrical diacetylene comprising: (a) contacting a diacetylene diol with a first organic reagent, which can react with one of the alcohol groups of the diol to form a new organic functional group, wherein the molar ratio of the diacetylene diol: first organic reagent is greater than 1:1, in a solvent in the presence of a catalyst and a base at a temperature at 0° to 100° C.; (b) contacting the reaction mixture from step (a) with a second organic reagent, in a molar ratio of the starting diacetylene diol: second organic reagent is less than 1:1, which can form the same new functional group as in (a) or a different functional group; (c) recovering said asymmetrical diacetylene from step (b).

We have also discovered that polymeric systems which form complexes or solid solutions with organic and inorganic compounds are extremely useful as binder/convertor compositions for radiation sensitive compounds, such as diacetylenes. Polyethyleneimine, ($-CH_2CH_2NH-$)$_n$, is a preferred polymer because it is water-soluble and forms complexes and/or solid solutions with a large number of inorganic compounds, such as boric acid and barium iodide which can be used as convertors for neutrons and X-ray radiation, respectively. A complex of polyethyleneimine (PEI) and boric acid (BA), referred herein as PEl/BA, is a preferred binder. This binder forms a transparent coating, and maintains the high radiation reactivity and low thermal reactivity of diacetylenes. This binder will form complexes with known convertors and phosphors, which when irradiated with high energy radiation, including thermal neutrons, emit lower energy radiation, such as UV light, X-rays, electrons, protons, and alpha particles which are capable of introducing chemical changes in the radiation sensitive materials, e.g., polymerization of diacetylenes. The convertors are also referred to as phosphors, fluorescence materials and screens herein.

By this invention there is further provided a self-developing film comprising at least one radiation sensitive material excluding a non-heat fixable conjugated diacetylene, a polymeric binder, e.g., polyethyleneimine, associated with a convertor, in a complex or solid solution, upon contact with high energy X-ray, gamma ray, neutrons, electrons, or laser radiation capable of forming an image.

We have further discovered that the images on the film can be substantially amplified by about a few orders of magnitude by incorporating the above referred to convertors into the substratum, the radiation sensitive layer and the top coat layers of the device. The film devices can be prepared with a subcoat and top coat containing convertors or fluorescence materials. A film containing a convertor, for example boric-10 acid, in the subcoat, radiation sensitive coat and the top coat is highly sensitive to thermal neutrons. Similarly, a film containing convertors, such as barium iodide and lead iodide in the subcoat, radiation sensitive coat and top coat is about times more sensitive to diagnostic x-rays, e.g., 60 KeV compared to 10 MeV X-ray, as compared to same film without the added convertors. Methods of intensifying the images with screens are also provided. The images can be further amplified by placing the said film in contact with image intensifying screens containing convertors during the irradiation.

We have furthermore invented processes of preparing emulsions/dispersions of binder/convertor compositions in association with the radiation sensitive element, e.g., diacetylene. The processes are exemplified with radiation sensitive formulations, such as diacetylenes. The term emulsion or dispersion is used for a fluid, semisolid or solid formulation where a composition is suspended in form of crystals or liquid droplets in a liquid or solid medium. The process can be used for a wide variety of compositions including a binder, convertor, and radiation sensitive element.

By this invention there is further provided a process for producing a suspension of microcrystals of a diacetylene in an aqueous film forming medium, involving forming an emulsion containing a diacetylene, binder, convertor, water, organic solvent, and surfactant, cooling the emulsion, allowing the solvent and water to evaporate leaving a film, the improvement which comprises using a totally or partially water-miscible solvent in forming the emulsion and cooling the emulsion by contacting it with liquid nitrogen prior to solvent and water evaporation.

The emulsions can be prepared by homogenizing a mixture containing the proper proportions of a solution of a convertor compound, a solution of a binder, solution of a radiation sensitive compound, and an emulsifying agent, at high speed and elevated temperature (e.g., 50° C.). The processes of the present invention provide stable fine emulsions, and microemulsions of diacetylenes at elevated temperatures. We have also discovered methods of making emulsions at high temperature without one or more of the following basic components for making an emulsion: (1) solvent for diacetylene, (2) solvent for binder, (3) binder, and (4) emulsifying agent. We have also discovered processes for making nonaqueous emulsions and semiaqueous emulsions as precursor materials for the radiation sensitive film.

We have also discovered processes of cooling the emulsions at a lower temperature for controlled crystallization of compounds, such as diacetylenes. In order to prevent agglomeration of emulsion droplets, the emulsions are solidified by pouring into liquid nitrogen.

We have also discovered means of controlling the size of the crystals of the compounds particularly diacetylenes, by controlling the effects of many parameters, including (1) the nature arid concentrations of the compounds, i.e., diacetylenes, solvents, binders, and emulsifiers, (2) temperature and degree of homogenization, (3) rate of quenching the emulsion, (4) temperature at which the emulsions are cooled, and (5) temperature of crystal growth. The nature and size of the crystals are also dependent upon the state of the emulsion upon cooling, i.e., whether the emulsion becomes solid or remains liquid.

We have also discovered a method of making the emulsions of radiation sensitive materials, e.g., diacetylenes, which involves making an emulsion of a solution of diacetylenes with a solution of a binder, quenching the emulsion at a lower temperature to freeze the emulsion quickly and then thawing the solid emulsion at a higher temperature for growing crystals of the diacetylenes. The preferred temperature and medium for quenching the emulsion is liquid nitrogen. For example, an emulsion of diacetylene solution in methylethylketone (MEK), PEI/BA in water and a surfactant can be prepared by high speed homogenization at 60° C. The emulsion is poured into liquid nitrogen to freeze the emulsion. The frozen emulsion does not develop color upon 254 nm UV irradiation. The crystal size is controlled by controlling the thawing temperature, The emulsion is thawed at about $-20°$ C. for the controlled growth of the diacetylene crystals. This method provides micron and submicron sized single crystals of the diacetylenes. The radiation sensitive film device can be prepared by coating the emulsion on a substrate, such as polyester film, skin and paper.

By this invention there is further provided in a process for producing a suspension of microcrystals of a diacetylene in an aqueous film forming medium, involving forming an emulsion containing a diacetylene, binder, convertor, water, organic solvent, and surfactant, cooling the emulsion, allowing the solvent and water to evaporate leaving a film, the improvement which comprises using a totally or partially water-miscible solvent, in forming the emulsion and cooling the emulsion by contacting with liquid nitrogen prior to solvent and water evaporation.

The invention also provides a means of protecting the radiation-sensitive film from ambient ultraviolet light. The film can be protected from ambient UV light by incorporating an appropriate amount of UV absorbers, such as maleic acid, sodium salicylate, benzophenone, or benzophenone tetracarboxylate into the top coat. The UV absorbers are not added into the top coat when screens emitting UV lights are used to amplify the image.

Also provided are flexible, non-brittle polymeric inorganic complexes useful in radiation sensitive films. Polymeric inorganic complexes, e.g., PEl/BA, are often brittle. A process of plasticization is further provided to make the coating pliable. The nature of the plasticizer will depend upon the polymeric complex. For example, the PEl/BA complex can be plasticized by adding an appropriate amount of fatty chain acids, e.g., propionic acid. Plasticization can also be achieved by incomplete, less than 1:1, complexation of PEl, in which an excess of PEl is present.

By this invention there is further provided a self-developing film for developing an image from exposure to ultraviolet or laser radiation comprising at least one conjugated diacetylene, or cocrystallized mixture thereof, capable of undergoing a color change upon polymerization when contacted with ultraviolet or laser radiation thereby forming an image, and a binder, forming a transparent film, wherein said image is capable of being fixed by heating said diacetylene at or above its melting point, or at the temperature at which the diacetylene undergoes a phase change to a radiation inactive phase.

Methods for the utilization of the radiation-sensitive film are also provided. The film can be used for a variety of applications including identification of items, a film for recording images and information, diagnostic and industrial radiography and monitoring radiation therapy and dose.

BRIEF DESCRIPTION OF THE INVENTION AND PREFERRED EMBODIMENTS

Figure 1:
FIG. 1. A schematic cross section of one embodiment of the film device of the invention where the substrate is coated on one side with the radiation sensitive layer.

The film device can be best described by reference to the FIG. 1. Referring to FIG. 1, the film device in its simplest form is comprised of a substrate 10 having at least one radiation sensitive layer 30 comprised of at least one radiation polymerizable diacetylenic composition 32 and optionally a convertor 34, which can also be present in other layers, e.g. 40 and 20, for converting high energy incident radiation to low energy radiation, dispersed, dissolved, or complexed in a polymeric binder 36. A plasticizer, 37 can also be present where the binder and convertor are present, e.g., in the layer 30 to provide flexibility to the coating. The substrate 10 may have a substratum layer, i.e. undercoat, 20, which can also contain additives, such as convertors 34, for increasing adhesion between the substrate 10 and the radiation sensitive layer 30. The radiation sensitive layer, 30 may have top coat 40 which may contain additives, such as a convertor 34. In order to protect the radiation sensitive layer from ambient light and mechanical abuses (scratches/abrasion) the device can also have a protective layer 50 which can also contain additives, such as UV absorbers 38. The substrate 10, the substratum 20, and the top coat 40, may contain other additives, especially the convertor 34 for converting high energy incident and secondary radiation to lower energy radiation which can initiate polymerization of diacetylenic composition 32. The image can be amplified by placing the film in contact with a screen, being a phosphor layer 60, on a substrate 70.

Figure 2:
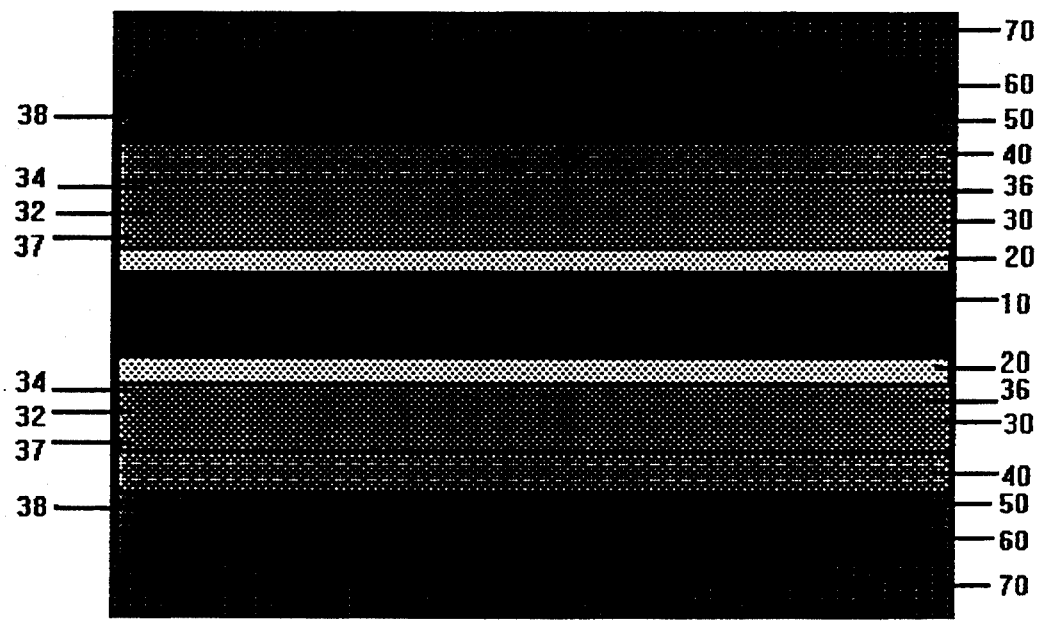
FIG. 2. A schematic cross section of another embodiment of the film device where the substrate is coated on both sides with the radiation sensitive layer.

The intensity of the image can be doubled as illustrated in FIG. 2 by having the radiation sensitive element 30, undercoat 20, top coat 40, protective coat 50, on both sides of the substrate 10, and can be further amplified by placing the film in contact with a phosphor layer 60 and phosphor support 70. The top coat 40, irradiation sensitive coat 30, undercoat 20 and protective player 50, can individually and collectively contain the same or different additives, such a convertor to amplify the image.

In general, the radiation sensitive layer 30 contains a diacetylene 32 and a binder 36 in a weight ratio by parts of 10:1 to 0.01:1 and preferably 1:1; and can also contain the diacetylene 32 and convertor 34 in a weight ratio by parts of 1:0.001 to 1:5 and preferably 1:0.1.

The radiation sensitive layer 30 generally is about 1 to 50 microns thick and preferably 5 to 20 microns thick; the thickness of the substrate 10 is generally 10 to 300 microns thick and preferably 50 to 200 microns thick; the substratum layer is 0.5 to 50 microns thick and preferably 1 to 5 microns thick; the protective layer 50 is generally 0.5 to 15 microns thick and preferably 1 to 5 microns thick.

The radiation sensitive diacetylene compositions applicable herein are those having general formula, $R'—C{\equiv}C—C{\equiv}C—R''$, where $R'$ and $R''$ are the same or different substituent groups. Though this class of diacetylenes is preferred, other diacetylenes having the following general formulas can also be used:

(1) Higher acetylenes: $R'—(C{\equiv}C)_n—R''$, where $n=3–5$, (2) Split di and higher acetylenes: $R'—(C{\equiv}C)_m—Z—(C{\equiv}C)_o—R''$, where Z is any diradical, such as $—(CH_2)_n—$ and $—C_6H_4—$, and m and o is 2 or higher, (3) Polymeric di and higher acetylenes: [—A—(—C≡C)ₙ—B—]ₓ, where A and B can be the same or different diradical, such as —(CH₂)ₙ—, —OCONH—(CH₂)ₙ—NHCOO—, and —OCO(CH₂)ₙOCO—. Where R' and R" can be same or different groups.

The preferred diacetylenes include those where R' and R" are selected from:

(CH₂)$_b$-H
(CH₂)$_b$OH
(CH₂)$_b$-OCONH—R1
(CH₂)$_b$—O—CO—R1
(CH₂)$_b$—COOH
(CH₂)$_b$—COOM
(CH₂)$_b$—NH₂
(CH₂)$_b$—CONHR1
(CH₂)$_b$—CO—O—R1 where b=1–10, preferably 1–2, and R1 is an aromatic radical, e.g. C₄-C₆ alkyl or phenyl, and M is a cation, such as Na⁺ or (R1)₃N⁺.

The preferred diacetylenes are the derivatives of 2,4-hexadiyne, 2,4-hexadiyn-1,6-diol, 3,5-octadiyn-1,8-diol, 4,6-decadiyn-1,10-diol, 5,7-dodecadiyn-1,12-diol and diacetylenic fatty acids, such as tricosa-10,12-diynoic acid (TC), pentacosa-10,12-diynoic acid (PC), and cocrystallized mixtures thereof. The most preferred derivatives of the diacetylenes, e.g. 2,4-hexadiyn-1,6-diol, are the urethane and ester derivatives. The following are some of the preferred derivatives of 2,4-hexadiyn-1,6-diol:

[A] Urethane (—OCONH—) derivatives, R'CH₂—C≡C—C≡C—CH₂R', including:
Hexyl Urethane: 166, R'=OCONH(CH₂)₅ CH₃
Pentyl Urethane: 155, R'=OCONH(CH₂)₄ CH₃
Butyl Urethane: 144, R'=OCONH(CH₂)₃CH₃
Ethyl Urethane: 122, R'=OCONHCH₂CH₃
Methyl Urethane: 111, R'=OCONHCH₃

[B] Ester (—OCO—) derivatives, R'''CH₂—C≡C—C≡C—CH₂R''', including:
Butyl Ester: 144E, R'''=OCO(CH₂)₃CH₃
Ethyl Ester: 122E, R'''=OCOCH₂CH₃
Methyl Ester: 111E, R'''=OCOCH₃

[C] Asymmetrical diacetylenes including:
156: R'—C≡C—C≡C—R",
where R'=CH₂OCONH(CH₂)₅CH₃
and R"=CH₂OCONH(CH₂)₄CH₃].

[D] Cocrystallized mixtures including:
Containing 80 weight percent or above of 166
85:15 mixture of 166 and 156
90:10 mixture of 166 and 156
and 4:1 mixture (TP41) of tricosadiynoic acid and pentacosadiynoic acid.

The urethane derivatives can be prepared by reacting e.g., 2,4-hexadiyn-1,6-diol with appropriate isocyanates (e.g. hexylisocyanate) in a solvent, such as tetrahydrofuran, using catalysts, such as di-t-butyltin bis(2-ethylhexanoate) and triethylamine as indicated below:

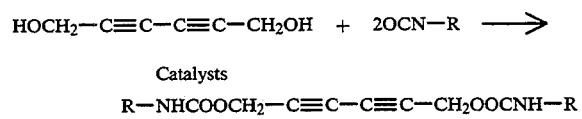

Ester derivatives can be prepared by reacting e.g., 2,4-hexadiyn-1,6-diol with appropriate acid chlorides in a solvent, such as dichloromethane, using a base, such as pyridine as the catalyst; i.e.,

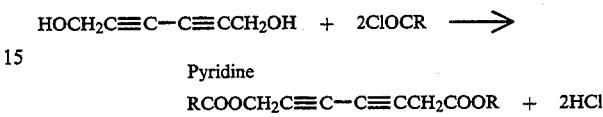

Asymmetrical diacetylenes can be prepared by the Cadiot-Chodkiewicz type reaction methods. Some properties of some asymmetrical urethane derivatives of 2,4-Hexadiyn-1,6-Diol are given below in Table 1.

| Compound Code | Structure | M.P. (°C.) | Color Upon UV irradiation |
|---|---|---|---|
| 156 | C₅H₁₁NHCO₂CH₂ (C≡C)₂CH₂O₂CNHC₆H₁₁ | 84–85 | Red |
| 167 | C₆H₁₃NHCO₂CH₂ (C≡C)₂CH₂O₂CNHC₇H₁₅ | 79.5–80.5 | Blue |
| 157 | C₅H₁₁NHCO₂CH₂ (C≡C)₂CH₂O₂CNHC₇H₁₅ | 62–64 | Red |

Several urethane derivatives of (1) 2,4-Hexadiyn-1,6-Diol, (2) 3,5-octadiyn-1,8-diol, [HO(CH₂)₂—C≡C—C≡C—(CF₂)₂OH], (3) 4,6-decadiyn-1,10-diol, [HO(CH₂)₃—C≡C—C≡C—(CH₂)₃OH], and (4) 5,12-dodecadiyn-1,12-diol, [HO(CH₂)₄—C≡C—C≡C—(CH₂)₄OH], were also prepared and cocrystallized to increase the reactivity of the other diacetylenes.

A preferred diacetylene for the invention film device is 166 [R—C≡C—C≡C—R, where R=—CH₂OCONH(CH₂)₅CH₃] because it has the following desirable properties:

1. It crystallizes into a highly reactive phase from a number of common solvents.
2. It has low thermal reactivity.
3. It partially polymerizes to a red color when irradiated with a moderate dose, e.g., up to 100 rads of ionizing radiation.
4. Upon heating near or above its melting point (85° C.), the red color changes to a permanent blue/black. A blue, gray, or black color is desirable for certain applications, such as diagnostic X-ray film.
5. It crystallizes into an inactive phase from its melt. The inactive phase has very little thermal and radiation reactivities. This property is especially useful in fixing the film thermally in a clean, nonpolluting, quick and rapid manner.

Though individual diacetylenes can be used, it is desirable to alter the reactivity of diacetylenes by cocrystallization. Cocrystallization can be achieved by dissolving two or more diacetylenes, preferably conjugated, prior to coating. As given in example 5, when TC and PC are co-crystallized, the resulting cocrystallized diacetylene mixture, such as TP41 (4:1 mixture of TC:PC) has a lower melting point and significantly higher radiation reactivity. The reactivity can also be varied by partial neutralization of diacetylenes having —COOH and —NH$_2$ functionalities by adding a base, e.g. NaOH, or an acid, e.g. HCl, respectively.

In order to maximize radiation reactivity, 166 can be co-crystallized with other diacetylenes, e.g. 16PA, 155, 157, 154 and 156, which are described above. Though certain diacetylenes, such as 155, increase the reactivity of 166, the partially polymerized cocrystallized diacetylenes provide a red color upon melting. However, 156 increases the radiation reactivity of 166 and provides a blue color upon melting the partially polymerized diacetylene mixture. 166 can be cocrystallized with different amounts of 156. Preferred is where the amount is 5–40 weight percent of 156 to 166, most preferred are 90:10 and 85:15 respective weight ratios of 166:156. As used herein "9010" and "8515" refer to these specific cocrystallized mixtures.

We have also discovered a new method for making asymmetrical derivatives of diacetylenes, such as 2,4-hexadiyn-1,6-diol. Asymmetrical diacetylenes are generally synthesized by the asymmetrical coupling method (Cadiot-Chodkiewicz type reaction). However, it is a multistep process with poor yields. We have developed processes for synthesis of asymmetrical diacetylenes which also provide the cocrystallized mixtures either in one or two steps. In the preferred method, a difunctional diacetylene, e.g., a diacetylene-diol is reacted with one reactant, (e.g., an isocyanate) such that the molar ratio of the diol is in large excess to the minor isocyanate. For example, to prepare the 90:10 mixture of 166:156, 5 mole percent of n-amyl isocyanate is added to the 2,4-hexadiyn-1,6-diol in tetrahydrofuran (THF) solvent in the presence of a tin catalyst, e.g. dibutyl tin bis(2-ethyl hexanoate) and a tertiary amine, e.g. triethylamine. Following this, 95 mole percent of n-hexyl isocyanate is added to the reaction mixture to complete the reaction to form the cocrystallized 90:10 mixture of 166:156 directly.

The procedure results in an almost quantitative yield for preparing mixtures of e.g., 166 and 156 in various proportions. The procedures for synthesis of 9010 (a mixture containing 90% of 166 and 10% of 156) and 8515 (a mixture containing 85% of 166 and 15% of 156) are given in Example 2 and Example 3, respectively. Using the procedures described in Examples 2 and 3, mixtures of 166 and 156 having different ratios were prepared, and purified by crystallization. The properties of various cocrystallized mixtures of 166:156 are given below in Table 2.

TABLE 2

Colors of Some Partially Polymerized Cocrystallized 166 and 156 Before and After Melting.

| Code Name | Wt. Percent 166 | Wt. Percent 156 | Color Before Melting | Color After Melting |
|---|---|---|---|---|
| 166 | 100 | 0 | Red | Blue |
| 9505 | 95 | 5 | Red | Blue |
| 9010 | 90 | 10 | Red | Blue/purple |
| 8515 | 85 | 15 | Red | Purple |
| 8020 | 80 | 20 | Red | Purple |
| 7525 | 75 | 25 | Red | Red/purple |
| 7030 | 70 | 30 | Red | Red |
| 6040 | 60 | 40 | Red | Red |
| 156 | 0 | 100 | Red | Red |

All cocrystallized mixtures listed in Table 2 provided an inactive phase upon melting. However, the color of the cocrystallized diacetylenes having more than 20% of 156 was red after fixing the film.

Other asymmetrical derivatives, including different functionalities, e.g., ester as one substituent and ure- thane as the other, can also be prepared. A procedure for synthesis of 90:10 mixture of 166 and 16PA is given in Example 4. Using the general procedures given in Examples 3, 4 and 5, it is possible to prepare a variety of other asymmetrical derivatives and their mixtures for cocrystallization.

Polymers having diacetylene functionality [e.g., $\{-R'-(C\equiv C)_n-R''-\}_x$, where R' and R'' can be the same or different diradical, such as $-(CH_2)_n-$, $-OCONH-(CH_2)_n-NHCOO-$ and $-OCO(CH_2)_nOCO-$ in their backbones are also preferred because of the fact that they are polymeric and do not require a binder.

The preferred diacetylenes are those which have a low (below about 150° C.) melting point and crystallize rapidly when cooled at a lower temperature, e.g. room temperature.

Another class of preferred diacetylenic compounds are those having an incorporated metal atom and can be used as in-built convertor. Diacetylenes having functionalities, such as amines, ethers, urethanes and the like can form complexes with inorganic compounds. It is possible to synthesize diacetylenes having an internal convertor which is covalently bonded, such as boron and mercury, lithium, copper, cadmium, and other metal ions. For example, the —COOH functionality of TC, PC and TP41 can be neutralized with lithium ion and synthesis of R—C≡C—C≡C—Hg—C≡C—C≡C—R is reported (M. Steinbach and G. Wegner, Makromol. Chem., 178, 1671 (1977)). The metal atom, such as mercury atom thereby incorporated into the diacetylene can emit short wavelength irradiation upon irradiation with photons and electrons. The following are some representative examples of preferred convertor-diacetylenes:

[A] R—C≡C—C≡C—Hg—C≡C—C≡C—R, where R is an aliphatic or aromatic radical.

[B] $\{-C\equiv C-C\equiv C-(CH_2)_n-C\equiv C-C\equiv C-Hg-\}_x$, where n=1 to 20 and x is higher than 2.

[C] M—OOC—(CH$_2$)$_n$—C≡C—C≡C—(CH$_2$)$_n$—COOM, and M—OOC—(CH$_2$)$_n$—C≡C—C≡C—Hg—C≡C—C≡C—(CH$_2$)$_n$—COOM, where M is a metal ion, such as Hg, Ag, Cu, Fe, and Li.

D] A—(CH$_2$)$_n$—C≡C—C≡C—(CH$_2$)$_n$—A, where A is an amine or ether complexed with an inorganic compound.

A radiation sensitive layer can be prepared by making an emulsion of diacetylene complexed with a convertor using a polymeric binder complexed with a convertor. This type of coating can be more sensitive to radiation and hence a significantly more intense image can be obtained, as both diacetylenes and the binder have convertors.

For certain applications, such as diagnostic X-ray imaging, it is desirable to have a black image. Most diacetylenes partially polymerize to either a blue or red color. A small number of diacetylenes, such as 2CU (R=—(CH$_2$)$_2$OCONH— cyclohexyl) partially polymerize to a yellow color. Some blue colored partially polymerized diacetylenes (e.g. 4BCMU, R=—(CH$_2$)$_4$OCONHCH$_2$COO(CH$_2$)$_4$H) change to a red color while others (e.g., 3ECMU, R=—(CH$_2$)$_3$OCONHCH$_2$COO(CH$_2$)$_4$H) retain their blue color upon heating. Many red colored partially polymerized diacetylenes, such as 144, remain red upon heating. In order to obtain a black color, one can use a mixture of diacetylenes including 166, in appropriate amounts to produce a black color which absorbs over a wider range of the visible region. A radiation sensitive layer containing more than one diacetylene particularly in cocrystallized form, to obtain the desired color is also preferred.

The following terminologies are used for defining the reactivity (polymerizability) of a diacetylene. The polymerizable form of a diacetylene(s) is referred to as "active". If a diacetylene is polymerizable with radiation having energy higher than 4 eV, wavelength shorter than 300 nm, then it is referred to as "radiation active". If it is polymerizable upon thermal annealing then it is referred to as "thermally active". A form of diacetylene which displays little or no polymerization is referred to as "inactive". If it displays little polymerization with radiation (having energy higher than 4 eV) then it is referred to as "radiation inactive" and if it is significantly nonpolymerizable upon thermal annealing, then it is referred to as "thermally inactive". Diacetylenes having reactivity/polymerizability characteristics in between these definitions are referred to as "moderately active". The most preferred form of diacetylene is one which is highly radiation reactive and displays little or no thermal reactivity. However, diacetylenes which are radiation active also usually have some thermal reactivity. Hence, the preferred form of diacetylene is one which is highly to moderately radiation active with little or no thermal reactivity. Thermal reactivity can be decreased and radiation reactivity can be increased by cocrystallization and molecular complexation. As an alternative, the film can be stored at lower temperature to slow down the thermal reactivity. Alternatively, the diacetylene can be prepared in a radiation inactive form and activated to the active form prior to use by contacting with an organic solvent.

Though diacetylenes are the most preferred radiation sensitive materials, other radiation sensitive materials can also be used for making the film device using the procedure and formulations described here. In addition to silver halides and mixtures thereof, ferric salts, potassium dichromate, aromatic diazo compounds, polycondensates of diazonium salts, the naphthoquinone diazides, photopolymers and photoconductive materials, silver molybdate, silver titanate, silver mercaptide, silver benzoate, silver oxalate, mercury oxalate, iron oxalate, iron chloride, potassium dichromate, copper chloride, copper acetate, thallium halides, lead iodide, lithium niobate, and mixtures thereof are also preferred s radiation sensitive compositions for making the film device using the convertors, the binders complexed with convertors and the processes of making the film emulsions described herein. The image of the film containing nondiacetylenic radiation sensitive compounds can be amplified by incorporating a convertor in the under coat, radiation sensitive coat and top coat, which emits radiation to which the said compounds are sensitive upon irradiation with higher energy radiation.

An opaque film can be used. However, it is desirable that the opaque film can become substantially transparent after processing, i.e., fixing. Several techniques, such as grinding the crystals into very fine particles and crystallizing diacetylenes into very fine particles can provide a transparent coating. A transparent film will provide a clear image with high resolution. For certain applications, a transparent coating is desirable but not required. As diacetylenes polymerize only in the solid (crystalline) state, they must be in the crystalline state in the binder. For clarity of the film, the binder for the diacetylene should be highly transparent. However, in order to avoid scattering and hence opacity, the preferred crystal size of the diacetylene is smaller than 300 nm, preferably less than 100 nm (1 micron). In order to obtain a transparent film, the refractive indices of the diacetylene and the binder should also be as close together as possible. The refractive index of organic materials is usually low and within a narrow range. Amorphous polymers are desirable but semi-crystalline polymers can be used as binders if they provide a significantly transparent coating. A crystalline polymer can be made amorphous by cross linking. Binders which wet the surface of the diacetylene crystals will also provide higher transparency. A wetting agent or surfactant can increase the wetting of the crystals by the binder. A binder which is transparent and has a refractive index close to that of diacetylene and/or preferably wets the diacetylene crystal surface. A coating or a film is considered transparent if over about 25% of the incident light is transmitted through the film. A film is considered opaque if more than about 75% of the light is absorbed, reflected or scattered rather than being transmitted through. A colored film can also be transparent at one wavelength of incident radiation if that light is not absorbed or partially absorbed. However, the same colored film can appear opaque to a different wavelength of incident radiation, if its color absorbs the incident radiation. The film of Example 22 has 70% transparency as described. In general, transparency, used as herein, is the measured transparency of the film to visible radiation prior to use.

The term "convertor(s)" is used for any material, substance, mixture, which can be complexed or doped with other substances, which when irradiated with high energy radiations, both ionizing and nonionizing, produces relatively lower energy radiation, either of the same or different type, via any process including scattering, attenuation, fluorescence, phosphorescence, and conversion. Inorganic and organometallic compounds are preferred as convertors because they have the ability to transfer/convert high energy radiation into lower energy radiation via many processes, such as scattering, absorbance, fluorescence, and phosphorescence. The selection of a convertor depends upon the type of radiation to be monitored and its energy. For example, lead and barium salts are good convertors for monitoring X-ray radiation and boron, lithium salts are good convertors for measuring thermal neutrons.

When high energy radiation strikes a metal, secondary electrons and other radiations of longer wavelengths are emitted. The emission of these secondary radiations become greater in materials with a high atomic number. Barium salts are especially preferred because they are nontoxic. Elements having high atomic number (Z), such as lead, are also preferred. Other convertors include alloys, salts, and free metals of zinc, tin, silver, tungsten, molybdenum, platinum, gold, copper, iodine, and bromine.

In general, it is not necessary for a binder to form a complex with metal salts. Preformed metal complexes can also be used as convertors. In addition, metal complexes and salts (ionic and co-ordination complexes including those forming hydrogen bonds) of ethylenediamine, porphines, crown ethers (e.g., cryptates), polyphosphates (hexametaphosphoric acid), aminocarboxylic acids (e.g., EDTA), 1,3-diketones (acetylacetone), hydroxycarboxylic acids (e.g., citric acid), aminoalcohols (e.g., triethanolamine), phenols (e.g., salicylaldehyde and chromotropic acid), aminophenols (e.g., oxinesulfonic acid), oximes (e.g., dimethylglyoxime), Schiff bases (e.g., disalicyladehyde 1,2-propylenediimine), sulfur compounds (e.g., toluenedithiol and thioglyconic acid) can be added to a binder to be used as a convertor combination as long they form an essentially clear coating. Polymer having these functionalities can be used as binders. However, it is not necessary to have a clear coating for the screen and for certain applications, especially if the coatings are on an opaque substrate, such as paper and skin. The process of mixing a finely divided convertor into a binder is given in Example 13. Instead of colloidal silica, a person skill in the art can also mix fine particles, prefereably, smaller than 500 nm, of other convertor materials, e.g., pyrophosphates of hafnium, germanium, zirconium, silicon and mixture thereof, into a binder and homogenize with a radiation sensitive material, such as a diacetylene to make the emulsion.

"Mix complexes", i.e., two or more metals complexed with one binder or a mixture of two polymers complexed with one metal, forming different types of complexes, can also be utilized. The ratio of metal to binder can be varied to additionally form phosphor materials.

The resulting image can be amplified by incorporating convertor materials into the radiation sensitive coat, under coat, top coat, and preferably into all three. The convertors will absorb high energy X-ray, radiation, electrons, and neutrons and convert the absorbed radiation into secondary low energy ionizing radiation. These secondary low energy ionizing radiations and nuclear particles, such as alpha particles emitted by the convertor can initiate polymerization of diacetylene. The secondary radiation, irrespective of its source can be absorbed by the convertor materials and emit tertiary ionizing radiation which in turn can also initiate polymerization of diacetylenes. When the secondary radiations are electrons, use of electroluminescence materials as convertors can amplify the image.

The image can be further amplified by placing the film into intimate contact with one or two screens made from convertor materials. The screens in their simplest form can be a plain metal foil and/or coated with a radioluminescence, electron luminescence or fluorescence phosphor material, which emits radiation of usually lower energy. We have observed that by placing the diacetylene film of Example 22 in close contact with (1) metal screens for converting megavolt radiations and (2) coatings made from the convertor materials of Tables 3 and 9, the image can be amplified several fold. The X-ray image can be amplified by using phosphor materials which emit energy higher than 4 eV as the screen materials. Phosphor materials which emit long wavelength UV light can be made to emit higher energy radiation by appropriate dopants, quantity of dopants and doping processes. An appropriate voltage can also be applied to the screens to produce secondary electrons which in turn can also initiate polymerization of diacetylenes, thereby also amplifying the image.

The nature of the desired convertor material used will depend upon the nature and energy of the incident radiation. To increase the contrast and response of the film, metal screens can be placed in direct contact with the film during the exposure to photons, and electrons of megavolt energy. The first screen can be thinner to prevent attenuation of the radiation while the second screen can be thicker. The first metal screen can also preferentially absorb scattered radiation and hence improve the contrast of the image. Secondary electrons are ejected from the metal by the radiation. Both absorption of scattered radiation and emission of secondary electrons becomes greater in materials with a high atomic number. Materials selected from the group consisting of Cr, Mn, Fe, Co, Ni, Zn, Zr, Mo, Ru, Pd, Ag, Cd, In, Sn, Sb, Ba, W, Pt, Hg, Bi, Pb, uranium, lanthanides and their mixtures and alloys can be used as the active material in an intensifying screen for imaging with X-rays, gamma rays or electrons. Lead (Pb) is a preferred metal for this purpose.

When high energy radiation, such as X-ray radiation of lower energy, e.g., lower than 1 MeV, becomes incident on certain substances, light is emitted (luminescence). The commercially available intensifying screens for diagnostic x-rays (10–200 KeV) produce white light. Silver halide film is sensitive to white light. Silver halide film is comparatively less sensitive to X-ray radiation. The diagnostic X-ray image is intensified by using an intensifying screen, such as those coated with zinc sulfide, barium lead sulfide, or calcium tungstate. The image on the silver halide film is intensified by as much as three orders of magnitude with these screens.

Any material, which is an organic, inorganic and/or organometallic compound, which emits radiation of wavelength lower than 300 nm, (energy higher than 4 eV) including those emitted by fluorescence and phosphorescence, upon irradiation with high energy radiation can be used as a convertor for the undercoat, radiation sensitive coat, top coat and the screens. In order to maximize the sensitivity of the film, the selection of a proper convertor is required. A convertor which has a high ability to absorb high energy radiation and emit high intensity radiation of significantly lower energy, but higher than 4 eV, is preferred.

In order to maximize the darkness of the image, the convertors should preferably be complexed with the binder. For example, lead and barium salts, e.g., lead iodide and barium iodide, form complexes with polyethyleneimine, PEl. However, lead is considered toxic. Thus, the element having a high atomic number which is nontoxic and inexpensive is barium. Additionally, PEI also forms complexes with several barium salts, such as barium iodide and barium sulfate. Complexes of PEI with metal iodides are preferred over other salts, e.g. chlorides, because of the high atomic number of iodine. The list of complexes of PEl are included below in Table 3.

TABLE 3

Properties of Complexes of PEI with Some Inorganic Compounds.

| Convertor | Concentrations | | Nature of the film |
|---|---|---|---|
| | PEI | Convertor | |
| Phosphoric acid | 10 ml 30% | 5.0 ml 85% | Tacky |
| Sulfuric acid | 30 ml 10% | 1.5 ml | Tacky, Acidic |
| Hydrochloric acid | 20 ml 30% | 13.0 ml | Tacky, Acidic |
| Hydroiodic acid | 10 ml 30% | 13.3 ml | Tacky, turns yellow |
| Zinc sulfate | 100 ml 7.5% | 7.0 g | Non-tacky |
| Zinc iodide | 10 g 30% | 2.5 g | Non-tacky |
| Barium iodide | 10 g 30% | 1.5 g | Non-tacky |
| Sodium iodide | 10 g 30% | 5.0 g | Tacky |
| Zinc oxide | 60 ml 10% | 0.6 g | Tacky |
| Cesium bromide | 100 ml 7.5% | 3.0 g | Tacky |
| Cesium iodide | 10 ml 7.5% | 4.0 g | Tacky |
| Lead iodide | 30 ml 10% | 2.8 g | Non-tacky |
| Barium bromide | 60 ml 10% | 3.0 g | Non-tacky |

Substances commonly known as cathode/electro luminescence materials, i.e., are materials which when contacted with electrons emit lower energy radiation. Electroluminescence phosphors, such as hafnium pyrophosphate and those substituted with zirconium, germanium and silicon, which emit UV light or can me made to emit UV light by doping are preferred phosphors. These materials can also be used as convertors if they emit radiation having energy higher than 4 eV, because the secondary electrons can induce cathode luminescence materials to emit UV and X-ray radiation which can initiate polymerization of diacetylenes.

A material which emits radiation having a wavelength shorter than 1 nm can be used as a convertor. Preferred are those which emit UV radiation in the range of 300 to 1 nm. UV radiation is rapidly absorbed by the diacetylene functionality and causes their polymerization. Hence, a preferred convertor should emit radiation of energy between 300 and 100 nm. Materials commonly known as phosphors include those from the II–VII Periodic Table group phosphors (e.g. ZnS, ZnCdS) and a rare earth phosphor (e.g. $Gd_2O_2S$, $Y_2O_2S$) and three elemental oxide phosphors (e.g. $CaWO_3$, $ZnSiO_4$). Convertors, such as barium lead sulfate, naphthalene-sodium iodide doped with Tl, $ZrP_2O_7$ (zirconium phosphate) which can emit UV light can be used. Properly doped phosphors, such as barium fluorochloride and lanthanum oxybromide, terbium activated rare earth oxysulfide ($X_2O_2S$ where X is gadolinium, lanthanum or yttrium), GdOS:Tb(lll), LaOS:Tb(lll), LaOBr:Tb(lll), LaOBr:Tm(lll), Ba(FCl)$_2$:Eu(ll), $SrB_4O_7$:Eu (stronsium europium borates), $BaSi_2O_5$:Pb (barium silicate), $(CeBa)MgAl_{11}O_{19}$ (cerium, bariummagnesium aluminate), strontium pyrophosphate activated with europium, and phosphates of zirconium, germanlure, silicon and hafnium can emit short wavelength UV light. The preferred phosphor is the one which emits short wavelength UV light (e.g., 300–50 nm).

For monitoring neutrons, compounds having a high neutron cross section are preferred convertors. The neutron cross section for boron decreases as the energy of neutrons increases. Naturally occurring boron compounds have about 20% boron-10. PEl forms a complex with boric acid. Boric acid (BA) is nontoxic and inexpensive. BA has only 5% solubility in water. However, PEl can form up to 1:2 molar complexes with BA. Higher concentrations of BA makes the film brittle and lower concentrations of boric acid keeps the film tacky. The optimum molar ratio of PEl:BA is about 1:1. The complex of PEl with BA is referred to as PEl/BA. We believe that PEl forms a complex with boric acid. However, it can be a neutral salt of a very weak acid (boric acid), with a relatively strong base (PEl). Films containing boron and lithium, especially boron, as a convertor can be used for monitoring thermal neutrons and boron-neutron capture therapy. Elements having high neutron cross section and emitting electrons and gamma rays, e.g., gadolinium, can also be used as convertor for neutrons.

The convertor can be mixed with the diacetylene in the radiation sensitive layer and/or with the under coat and the top coat. Diacetylene particles can be coated on the convertor or vice versa. The diacetylene layer can also be sandwiched between two layers of convertors. In order to avoid or minimize internal absorption (absorption by the convertor itself) of the emitted secondary radiation, which are responsible for polymerization of diacetylenes, the convertor should be very thin and transparent. The binder should be significantly transparent to the secondary radiation emitted by the convertor. For example, the complexes of PEl in Table 3 are transparent to UV light except that of lead iodide.

Although any solid substrate having a smooth surface can be used, a preferred substrate is a flexible and transparent plastic film. Plastic films, such as polyethylene, polypropylene, polyvinylchloride, polymethylmethacrylate, polyurethanes, nylons, polyesters, polycarbonates, polyvinylacetate, cellophane and esters of cellulose can be used as the transparent substrate. The most preferred substrates are the 15–300 microns thick films of polyethylene terephthalate, polycarbonate (polycarbonate of bisphenol-A), cellulose acetate and poly(vinylacetate) having high transparency (higher than 60%) and good dimensional stability. A paper, e.g., photographic paper, can also be used as a substrate. Metal foils, such as aluminum can be used. Depending upon the utility, the substrate can be any surface, including human skin, when the coating material is in form of an applied lotion or cream.

Strong adhesion of the radiation sensitive layer with the substrate film is essential. If the coating does not adhere to the base film, it usually flakes off. The adhesion of PEl/BA with polyester film is generally very poor. The coating often flakes off when the film is bent. In order to increase the adhesion of the coating to the substrate, a thin coating, known as a subcoating, undercoat or substratum, which has ability to bond with substrate, such as polyester base film and the radiation sensitive coating, is applied on the polyester film. The nature/composition of the substratum will depend upon the nature/composition of the binder. For example, when gelatin is used as the binder, the substratum layer for polyester (e.g. Mylar) can be composed of cellulose ester (e.g. cellulose acetate) and gelatin in a water/acetone solution.

In order to increase the bonding of PEl/BA with polyester film, several substratum formulations were developed. The molar ratio of PEl:BA used is usually 1. However, if the molar ratio of PEl to BA is more than 1, e.g., 1.1, with a slight excess of PEl, the coating provides satisfactory adhesion. However, higher concentrations of PEl makes the coating moisture sensitive and on a hot and humid day the coating will develop a slight tackiness.

Other substratum formulations can contain two polymers, one polymer providing bonding with the substrate while the other provides bonding with the radiation sensitive coat. The substratum coating can be about a few microns thick. The following formulations provided satisfactory substratum coatings: polyvinylacetate plus Gelatin, PEl plus polyvinylpyrrolidone (PVP), and polyvinylpyrrolidone plus polyvinylacetate. Polymers, such as polyvinylacetate form a strong bond with Mylar ® while the water soluble polymers e.g. PVP, form a bond with PEl/BA. A representative substratum formulation which provides satisfactory adhesion with Mylar ® and PEl/BA is given below.

A preferred formulation for the substratum is provided in Example 10. Nine parts of 10% polyvinylacetate in ethanol:water (4:1) were mixed with 1 part of 10% low molecular weight polyacrylic acid in ethanol. The molecular weight of polyacrylic acid was 2,000. Polyvinylacetate bonded with Mylar ® while polyacrylic acid bonded with PEl/BA. Polyacrylic acid formed a bond with PEl/BA acid because the acid functionality (—COOH) of polyacrylic acid can form a bond with the amine functionality (—NH—) of polyethyleneimine.

The preferred substratum formulation can contain a convertor, such as lead iodide, barium iodide, zinc sulfate and sodium iodide or a phosphor material which is capable of producing radiation of lower energy when irradiated with the high energy radiation thereby enhancing the image as shown in Example 31.

Strong adhesion of the radiation sensitive coat is not required when the coating material is in form of an applied lotion or cream which can be wiped off the surface, e.g., skin, after irradiation.

Different polymeric materials are constantly being searched for in an effort to find one which can incorporate a sufficient quantity of converter material to produce a transparent film which will amplify the image produced by the diacetylene when exposed to high energy radiation. A binder is a polymeric or nonpolymeric, organic or inorganic, including organometallic, material which embed the radiation sensitive materials, such as diacetylene and silver halide. Any polymeric material which has the ability to form a transparent coating, preferably forming a complex or dissolving an inorganic compound (e.g., to form a solid solution) can be used as a binder for the radiation sensitive material. We have demonstrated that both water soluble and water insoluble polymers can be used as the binder. A mixture of two or more solids is referred to herein as a solid solution, if (1) one of the solids of the mixture has not crystallized or precipitated out as a separate phase, (2) the mixture precipitates as a highly amorphous solid, or (3) fine particles of one solid in the mixture are covered with the other solid when solidified from their solution or melt, to minimize the scattering of the incident light. Since the scattering of the light will be minimum, the coating of a solid solution will appear significantly transparent.. The coatings of the solid solutions When a water insoluble polymer is used as the binder in a nonaqueous system, organometallic compounds and complexes can be added as convertors. For the water soluble polymers, inorganic compounds, which either form a complex, e.g. a Lewis acid-base pair, or a solid solution as described above with the binder, can be added to a polymeric solution. Polymers having the following functionalities can be used as water soluble binders:

1. Polyacids: Polyacrylic acid.
2. Polyamines: Polyethylene amine, polyvinyl pyridine, polyethyleneimine.
3. Polyethers: Polyethylene oxide and polyvinylethers.
4. Polyalcohol: Polyvinylalcohol.
5. Polyamide: Polyacrylamide.
6. Gelatin A number of water soluble polymers, such as gelatin, polyethylene oxide, polyacrylic acid, polyvinylalcohol, polyvinylpyrrolidone, polyvinylpyridine, polyacrylamide, and polyethyleneimine were tried as the binders. Although a wide variety of polymers can be used as a binder for the radiation sensitive material, the preferred polymer should have the capability of forming a complex or solid solution with the convertor. Polyethyleneimine, $(-CH_2-CH_2-NH-)_n$, is a preferred binder because of the following reasons:

1. It complexes with a large number of inorganic compounds, which can be used as convertors, e.g., boric acid and barium sulfate, to form water soluble complexes.
2. Even though PEl is tacky and hygroscopic, some of the complexes are nontacky and significantly less hygroscopic.
3. The water soluble complexes of PEl provide a highly transparent coating.
4. Highly stable emulsions of diacetylenes can be prepared in solutions of the complexes.
5. The emulsions prepared in solutions of the complexes have a high radiation reactivity and very little thermal reactivity.
6. PEl is considered nontoxic. It is used industrially for waste water treatment.

In order to alter the binder properties, such as water solubility, PEl can be crosslinked with crosslinking agents, such as diisocyanates, diacid chlorides, and aldehydes. We crosslink PEl with glutaraldehyde. PEl of higher molecular weight, 10,000 to 5,000,000 is preferred. A preferred concentration of PEl in the film emulsion is 5–30%, the most preferred is 10–20%. Higher molecular weight binders will provide higher viscosity. We have observed that size of the crystals decreases with increase in viscosity of the binder solution.

When a polymer forms a complex with an inorganic material, it often becomes brittle. For example, PEl is an adhesive. However, a 1:1 molar mole complex of PEl/BA is slightly brittle. The binder convertor composition should be flexible so that it does not crack when the film is bent. Plasticization of the binders will depend upon their chemical structure. A chemical which is a good plasticizer for one plastic may not be a useful plasticizer for another. For complexes of PEl, preferred plasticizers are paraffinic acids, such as heptanoic acid, hexanoic acid, palmitic acid, oleic acid, and propionic acid. The plasticizers can also be chemically bonded with PEl by reacting PEl with a fatty chain isocyanate and acid chloride. Plasticized PEl is significantly less sensitive to moisture.

Many water insoluble polymers are known to form complexes with organometallic compounds (Organometallic Polymers, C. E. Carraher Jr., J. E. Sheets, and C. U. Pittman, Jr. (Editors), Academic Press, NY 1978; Metallorganic Polymers, K. A. Andrianov, Interscience Publishers, NY 1965, Polymer-metal complexes; M. Kaneko and Elshun Tsuchida, J. Polym. Sci., Macromolecular Reviews, 16, 397, 1980). Conductive polymers, such as polyacetylene, polythiophenes, polyquiniline, and polyaniline when complexed/doped with metal salts, such as arsenic pentafluoride, bromine, iodine can also be used polymeric convertors. Inorganic polymers, such as poly(phosphazenes), polysiloxanes and poly(metallo-siloxanes), poly(carborane-siloxanes), poly(sulfur nitride), poly(metal phosphenates) can also be used as polymeric convertors.

Gelatin, the most widely used binder for radiation sensitive materials, has many desirable properties, such as high solubility in water above about 50° C. and the ability to gel or swell below 45° C. for wet processing of the exposed film. Many of these properties are not required if the processing of the film is dry. A large number of binders can be used if the processing, e.g., developing and fixing of the film, is a dry process. Gelatin complexed or in form of solid solution with convertor is a also a preferred binder.

If the binder has the ability to form a complex or solid solution, one can use higher concentrations of the radiation absorbing material including fluorescent and convertor materials. Gelatin is a poor complexing agent. It is also poor in forming solid solutions with inorganic materials. However, we have found that as shown in Example 11, gelatin can also form complexes or solid solutions with inorganic compounds. Complexed gelatin or solid solutions of gelatin with convertors is a preferred binder system.

The binder polymers can be homopolymers, copolymers, graftcopolymers, block copolymers, polymeric alloys and mixtures thereof.

A top coat of about 0.5-2 microns, also known as a supercoat, is usually applied to make the coating resistant to abrasion. The top coat can contain a convertor, such lead iodide and sodium iodide which is capable of producing radiation of lower energy when irradiated with the high energy radiation thereby enhancing the image. Enhancement of the image by incorporating a convertor in the top coat is shown in Example 30. Although the polymers in the radiation sensitive coat, sub-coat, and top coat can be different, the convertor material can be the same or different depending upon the binder used. Gelatin is widely used as the protective coat. Other polymers which can provide scratch resistant coating can also be used as protective coat. As the film does not require wet processing, any scratch resistant polymers can also be used as the top coat. As an alternative to gelatin, we top coated the film with polyisobutylmethacrylate from cyclohexane solution. Cyclohexane is a nonsolvent for most diacetylenes and hence does not affect the reactivity or the nature of the crystals. Polyisobutylmethacrylate provides a very hard coating. The protective coat can also contain a convertor material, a low molecular weight UV absorbing compound, and other additives, such as an antistatic compound.

The PE1/BA/diacetylene coating can be top coated with a water soluble polymer, such as gelatin and polyvinylpyrrolidone. Gelatin provides a satisfactory top coat. Gelatin dissolves in water only above about 30° C. A five percent solution of gelatin is applied to the coating of PE1/BA/9010 at about 40° C. using a wire wound rod. Gelatin solution can dissolve PE1/BA but does not dissolve the crystals of the diacetylene. The bonding of gelatin with PE1/BA is excellent, i.e., it passes the cross-hatch test and the coating is scratch resistant.

If the top coat contains additives, such as a convertor, a scratch resistant protective coat can be applied on the top coat. This top coat can be gelatin without a convertor. Gelatin is preferred but any polymeric material, such as one of the polyurethanes, polyepoxy, and polyacrylics, which provides hard protective coat can also be used.

The diacetylene film will generally not require protection from white light and hence a black/opaque protective envelope is not essential for its storage and handling. However, as diacetylenes are sensitive to short wavelength UV light, the films preferably should be stored in a UV absorbing film envelope, such as Mylar ® or Llumar ®, to protect it from ambient UV light and air pollutants. In order to protect the film from short wavelength UV light, the coating of PE1/BA/9010 is also coated with gelatin containing a UV absorber, such as maleic acid, sodium salicylate, benzophenone, or benzophenone tetracarboxylate. These are the conventional UV absorbers used in sun-tan lotions.

A blue film of 4BCMU in polyethyleneoxide irradiated with 100 rad appears substantially darker when viewed with red light and substantially lighter when viewed with green light. The red film appears much darker when viewed with green light. When viewed with white light, the diacetylene film appears lighter because it does not absorb blue light of the visible region. However, silver halide film absorbs over the entire visible region. Hence, use of an appropriate light will make the image appear much darker. Alternatively, a mixture of appropriate diacetylenes and dyes can provide a dark/black image upon irradiation. Addition of appropriate dyes and viewing of the film with appropriate color filter or color light is preferred.

Figure 3:
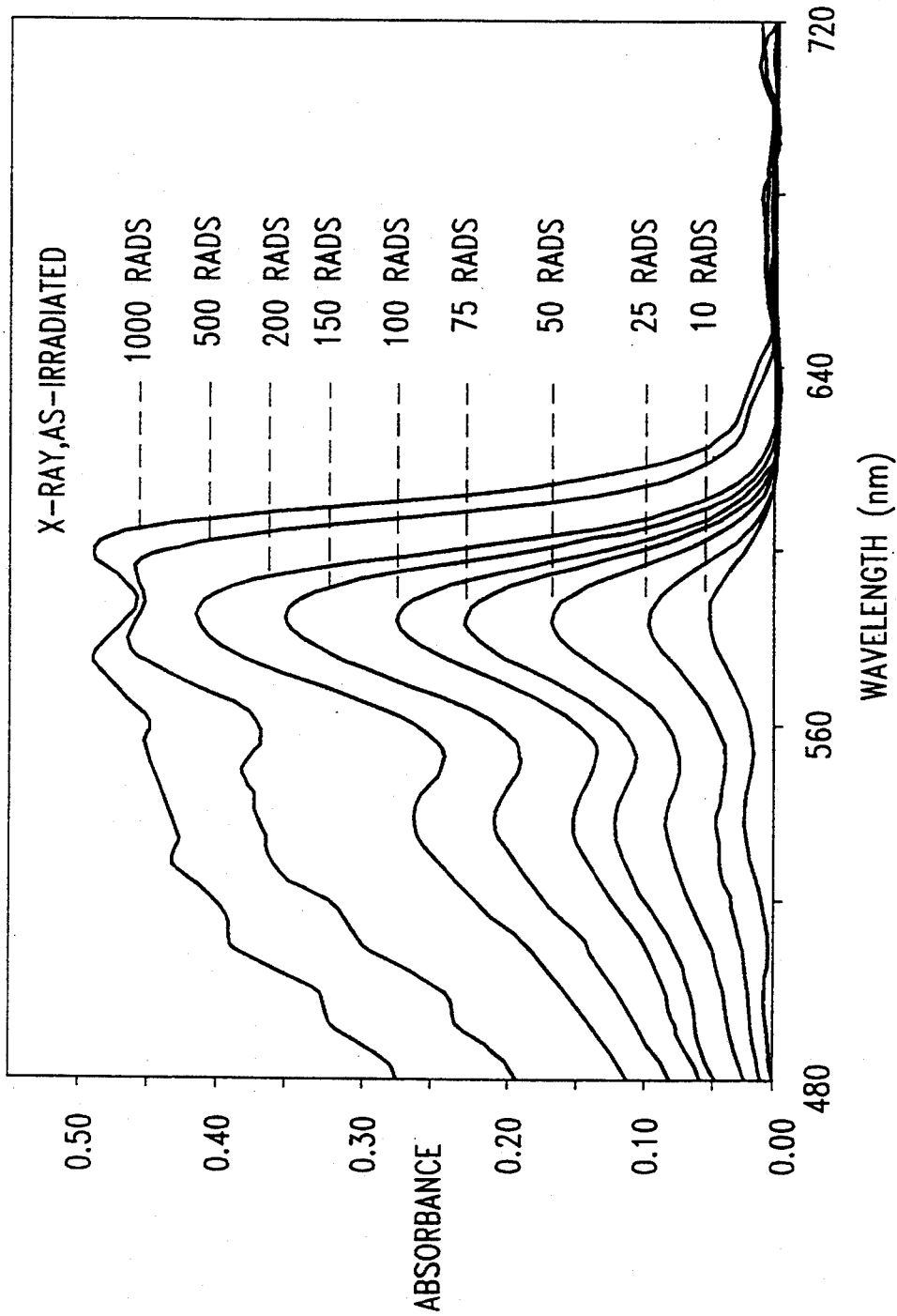
FIG. 3. Visible spectra of partially polymerized 8515 film irradiated with different doses of 10 MeV X-ray radiation.
Figure 4:
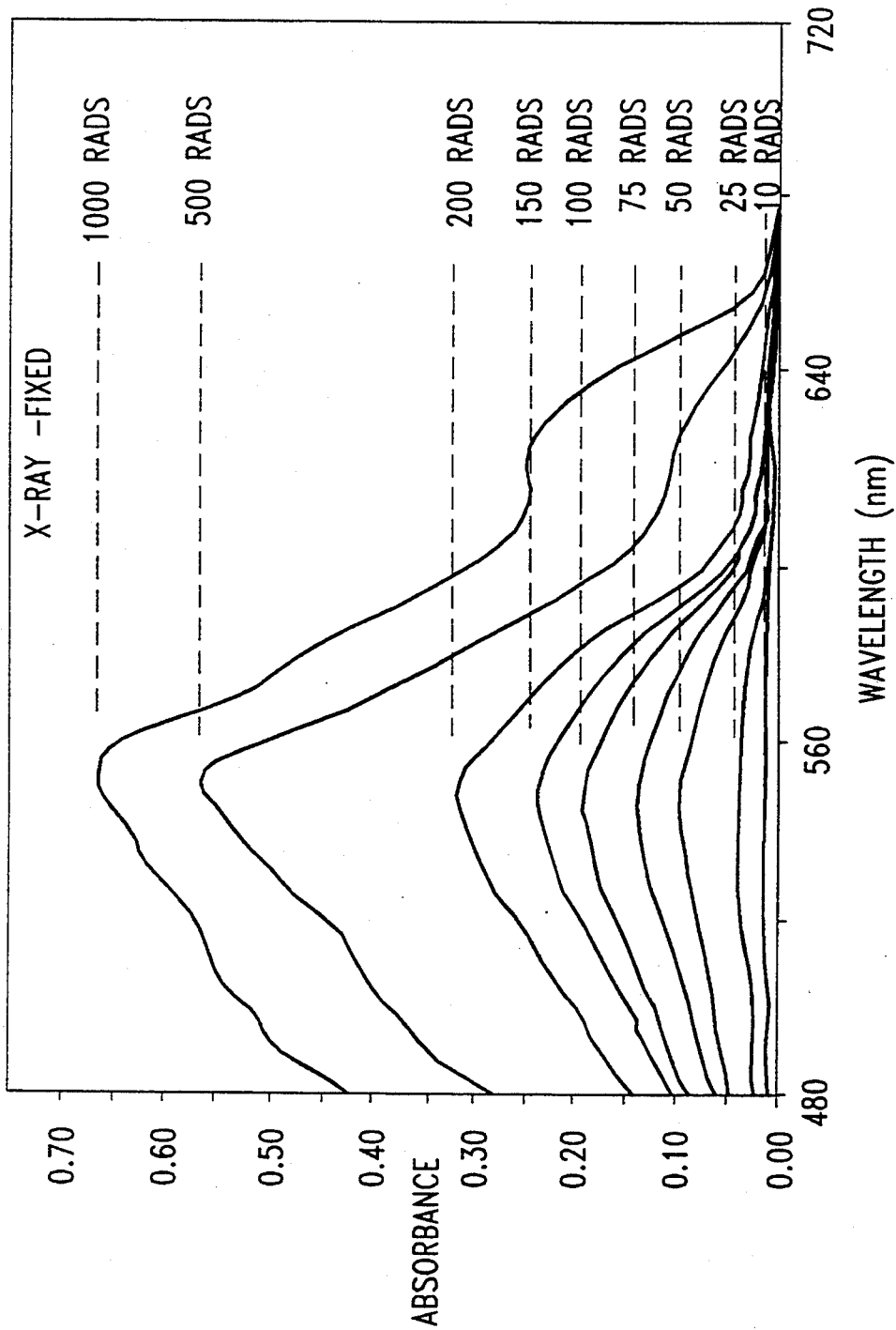
FIG. 4. The partially polymerized 8515 film of FIG. 3 fixed by annealing at 80° C. for 5 minutes.

Upon irradiation, the diacetylene(s) will polymerize to a noticeable, visible color. A film of Example 22 was irradiated with different dosages of 60 KeV X-ray, gamma rays from cobalt-60, 10 MeV X-rays, 12 MeV electrons, and 20 MeV neutrons at different dosages. Optical density and visible spectra were recorded. As shown in FIGS. 3 and 4 the radiation dose can be accurately determined with a spectrophotometer. A densitometer can be used for the determination of optical density and a quick estimate of radiation dose. A scanning densitometer can also be used to prepare dose distribution curves effectively. Appropriate color filters can be used.

The digital imaging technology can be used for enhancement of the images. Most of these systems digitize the film via high quality, low noise video camera, or laser scanning techniques and process the data with a specialized graphic processor or a digital imaging computer.

The diacetylenic film is a self-developing device, i.e., it develops its own color while being irradiated. However, after the exposure, the film requires deactivation (fixing) of the developed image by making the unreacted molecules inactive. If, after the exposure, the diacetylene is not deactivated, the unreacted molecules will undergo slow thermal polymerization during the storage or unintended exposure to ionizing radiation. There are several ways a diacetylene film can be fixed: (1) by extraction of the unreacted monomer molecules with a nontoxic solvent, such as ethanol, (2) by selective destruction of conjugated triple bonds, with a chemical agent, such hydroxylamine, (3) by selective reaction of the functionalities of the side groups, such as ester, thereby making the diacetylene inactive, (4) by isomerization of the conjugated triple bonds, (5) forming a complex with diacetylene or chemical functionality of the side group, e.g., via hydrogen bonding, (6) making diacetylenes inactive, and (6) by combination of two or more of the above methods.

Diacetylenes having functionality which can be chemically or physically converted to another functionality or form which provides nonpolymerizable form is also a preferred process for fixing the film. Diacetylenes, such as 4BCMU, TC, PC and TP41 can also be permanently fixed with a base, such as sodium hydroxide and sodium carbonate. When blue films of 4BCMU and TP41 are dipped in either a 5% solution of sodium hydroxide or 30% solution of sodium carbonate, they permanently change to red color in about five minutes at room temperature. The hydrolyzed (in case of 4BCMU) and neutralized (in case of TC, PC and TP41) unreacted molecules become inactive to both high energy radiation and temperature. The fixing of the diacetylenic film can be done under ambient light. Chemical fixing with compounds which react or complex with diacetylene or the side group functionalities is a preferred process of fixing the film.

One of the effective fixing solutions for the diacetylene film can be a solution of a base, such as sodium hydroxide, in a solvent system, such as aqueous ethanol. As ethanol is a nonsolvent for gelatin it will prevent excessive swelling. Ethanol will extract unreacted monomer out of the swollen binder and facilitate the reaction of sodium hydroxide with diacetylene. Sodium hydroxide will also make the monomer molecules inactive (unpolymerizable) by isomerization of conjugated triple bonds to cumulene and hydrolysis of the ester and urethane functionalities of the side groups. The most preferred base for fixing the film are one of the alkali metal hydroxides, alkali metal carbonates and phosphates, and quaternary ammonium hydroxides. They include, sodium hydroxide, potassium hydroxide, sodium carbonate, potassium carbonate, potassium phosphate, ammonium hydroxide, tetraethyl ammonium hydroxide and dibutylamine.

The most preferred solvent type fixing agents are water soluble of low toxicity, such as ethanol, acetone, isopropanol, tetrahydrofuran, dimethylformamide, dimethylsulfoxide, glyme and glycerol.

The image can be further amplified and made darker and absorbing in the regions of visible spectrum by making diacetylenes or the radiation polymerized diacetylenes react/complex with reactants, such as dyes and indicators. The dye/indicator can react/complex with the backbone or side chains of polydiacetylene. The nature of the dye/indicator also depends upon functionality or nature of the side group ("R") of the diacetylenes. We have found that several dyes can be used for the amplification of the image. A red image of partially polymerized 4BCMU can be made darker by dipping the image in a solution of alkali blue 6B. TC, PC and TP41 has —COOH functionality and it can react with a number of carboxylic acid sensitive dyes, such as bromophenol blue. A poly(TP41) chain has a number of —COOH functionality. Each —COOH functionality can react with a pH dye. Hence, poly(TP41) molecule will appear significantly more intense. Similarly, using proper indicators, dyes and complexing agents, one can substantially amplify the image. Dyes, such as Acid Blue 113, Fast Green FCF, Alphazurine A, Guinea Green B, Erioglaucine, Pararosaniline Acetate, Pararosaniline Base, Ethyl Violet, Brilliant Blue G, Brilliant Blue R, Alkali Blue 6B, Tetrabromophenolphthalein, Victoria Blue, Lissamine Green B, Phloxine B. Erythrosin B, Rose Bengal, Basic Blue 3, Nile Blue, Methylene Blue, Methylene Green, Stains All, Disperse Blue 3, Alcian Blue 8GX, Prussian Blue, Tetraphenylbutadiene, and Dicinnamalactone can be used for intensification of the image.

Many diacetylenes, such as 155, 166, 156 and their cocrystallized mixtures can be crystallized into inactive forms from their melt. Diacetylenes which do not undergo a phase change to an inactive phase upon heating can be fixed upon heating if the coating also contains reagents which can chemically or physically (e.g., via hydrogen bonding) react with functionalities of diacetylene molecules and make them unpolymerizable. It is preferred that the binder has the ability to react to make molten diacetylenes inactive. The most preferred method of fixing the film is dry fixing.

Ionic and nonionic surface active agents can be used as emulsifiers. Pluronic ®, Gafac ® RS-710, sodium dodecyl sulfate, cetyltrimethyl ammonium chloride, ethoxylated para-octylphenol, 2-ethyl-hexyl alcohol ethoxylate, lecithin, polyethylene glycol and PEG-dodecylether are some examples of surfactants which can be used to make the emulsion. Use of inorganic surfactant/emulsifiers, e.g., zinc oleate is preferred as they can also act as convertor materials. Preferred concentration of surfactant in the mixture is 0.01 to 5%, most preferred is 0.1-1%.

A wide variety of solvents, from completely miscible, e.g., methanol to immiscible, e.g., dichloromethane and ethylacetate, in water, can be used to make the emulsion. The use of different solvents is demonstrated in Examples 14, 17, 18, 19, 20, and 22. The preferred solvents are methanol, MEK, ethylacetate and toluene. Preferred concentration can be 5–80%, most preferred concentration range is 10–30%.

The emulsion can be prepared by processes, such as high speed homogenization and ultrasonication. Vigorous agitation, e.g., high speed (100 rpm to 20,000 rpm) stirring is a preferred method of making the emulsion. In the case of a microemulsion, the mixture is usually clear and hence, may not require vigorous agitation.

The temperature of homogenization or emulsification will depend on the mixture. The preferred temperature is above room temperature to up to about 100° C. The most preferred temperature range is 40°–70° C.

An emulsion can be prepared by using techniques described in "Encyclopedia of Emulsion Technology, P. Becher (Ed.), Marcel Dekker, New York, 287 (1983); "Practical Emulsions", H. Bennett, J. C. Bishop Jr., and M. F. Wulfinghoff, Chemical Publishing Company, New York, 1968; and "Microemulsions: Structure and Dynamics", S. E. Frieberg and P. Bothorel, CRC Press, Boca Raton, Fla. Ernulsions are usually prepared by homogenizing/emulsifying two immiscible liquids, e.g., a water immiscible solvent (e.g., toluene) with water using an emulsifying agent, such as a surfactant. We have discovered several processes of preparing emulsions/dispersions of compositions. The processes are exemplified with radiation sensitive formulations, such as diacetylenes.

The methods of making emulsions of diacetylenes are preferred without one or more of the following basic components for making emulsion: (1) solvent for diacetylene and binder, (2) binder (3) emulsifying agent. These processes are described in Examples 14–21. The processes of making nonaqueous emulsions, Example 18, and semi-aqueous emulsions, example 19–21 are also preferred. Using one or more of the above methods, it is possible to make an emulsion of most diacetylenes under a variety of conditions, such as the use of a nonaqueous binder. The emulsions should be cooled to a lower temperature for crystallization of diacetylenes. In order to prevent agglomeration of emulsion droplets, the emulsions are solidified by pouring into a volatile liquid, such as liquid nitrogen and ammonia. The preferred methods of controlling crystal size are by controlling parameters, such as (1) nature and concentrations of diacetylene, solvents, binder, and emulsifier, (2) temperature and degree of homogenization, (3) rate of quenching the emulsion, (4) temperature at which the emulsions are cooled, and (5) temperature of crystal growth.

The emulsions and processes are such that either at room temperature or at the temperature of coating, the radiation sensitive compositions crystallize out and hence evaporation of the solvent used to dissolve the radiation sensitive composition is not required. However, reduced amount of the solvents is desired in raising the temperature of drying the coating and to minimize the air pollution.

Only processes where crystals do not grow by cooling the emulsion at room temperature is where the emulsion can be made with a solvent which is very good solvent for the radiation sensitive composition and is highly insoluble in water. For example, an emulsion made by emulsifying a solution of a diacetylene in a solvent, such as toluene and ethylacetate with water. When this process is used, the crystals grow on the substrate after the emulsion is coated on the substrate. For all other processes, evaporation of solvent is not required for the crystal growth prior to coating. For those processes, the crystals grow once the emulsion is cooled to a lower temperature, e.g., below the crystallization temperature.

The preferred temperature for cooling the emulsion is at room temperature or below. The preferred method of cooling the emulsion is by quenching the emulsion quickly to the desired temperature, for example, by (1) pouring the emulsion in a cooled tray, (2) by passing it through a cooling coil, and (3) by pouring in a volatile liquid, such as liquid nitrogen. If the emulsion is cooled quickly to a lower crystallization temperature, narrow distribution of the crystals is obtained, The preferred method of quenching is pouring the emulsion into a cold volatile liquid, such as liquid nitrogen mainly because (1) it does not require aging of the emulsion, (2) freezing of the emulsion prevents the emulsion droplets from accumulation, (3) crystal size can be controlled from a fraction of a micron to several microns thick, (4) it can be easily scaled up, (5) emulsions of a large number of diacetylenes can be formed in a variety of binders in both aqueous and nonaqueous systems, and (6) once the emulsion is solidified with liquid nitrogen, it can be thawed at any time.

The emulsions can be coated on a substrate using conventional or specialized coating techniques including a Bird type film applicator (doctors blade or knife over roll technique), gravure bars and wire wound rods. The wire wound rods provide a more uniform coating in the laboratory. A piece (e.g., $15 \times 30$ to $30 \times 45$ cm$^2$) of polyester film is placed on the platform of a draw down machine (Precision Draw Down Machine, Paul Gardener Company, Pompano Beach, Fla.). An emulsion is poured in front of a wire wound rod (usually number 20 or 30). The rod is pulled at an even motion. The film is removed and the coating is allowed to dry at room temperature.

For best performance, the formulations and the processes for making the film should be optimized. The following formulations and processes represent optimized processes for making the film:

DIACETYLENES: The 9010 and 8515 cocrystallized diacetylene mixtures provide the best compromise between reactivity, color, crystal growth, and thermal fixing ability. Films were made from both the formulations using a pilot plant coater. The 8515 film was characterized and used for the field testing.

BINDER: PEl has very low toxicity and forms complexes with a large number of convertors for neutrons, electrons and X-ray radiation, PEl/BA provided a transparent coating and good control properties over crystal size. The concentration of PEl/BA is generally about 25% (total solid).

SOLVENT: MEK was used as a solvent for 9010 and 8515. MEK has low toxicity, forms better emulsion with PEl/BA solution, has high solubility for diacetylenes, yields highly reactive phases of 9010 and 8515, and reduces the thermal reactivity.

RATIO OF BINDER:DIACETYLENE: Mixtures of the binder and 9010/8515 having a ratio of 5 to 0.3, particularly 4.3, provided a transparent film.

EMULSION PROCESS: A mixture of PEl/BA/DA/MEK forms a very fine emulsion at 60° C. at a high speed of homogenization within a few minutes. The ratio of PEl/BA/8515/MEK used in large scale preparations is given in Examples 21 and 22.

CRYSTAL GROWTH PROCESS: Quenching the emulsion with liquid nitrogen freezes it and thawing the frozen emulsion at higher temperatures (e.g., 15° C.) provided control over the particle size of the crystals. Annealing the frozen emulsion between 15° and 20° C. provided crystals of about 0.5–1.0 micron thick and 3–20 microns long.

METHODS OF COATING: In the laboratory wire wound rods were used while on a larger scale, reversed roll gravure methods for coating was used. In the laboratory, most of the coatings were allowed to dry at room temperature over a few hours period while on the larger scale the coatings were dried between 35° and 50° C. in about five minutes.

SUBSTRATE: Polyester was chosen for its dimensional stability and clarity.

SUBSTRATUM: Commercially available Cronar ® film which has a subcoat of gelatin and another proprietary polymer were used.

SUPERCOAT: Gelatin was used as the supercoat because of its scratch resistant properties. The thickness of the supercoat was about 3 microns.

THICKNESS: As a compromise between the reactivity and transparency characteristics, the thickness of the radiation sensitive coat (PEl/BA/8515) was about 15 microns.

FIXING 8515: One of the main reasons for the selection of 9010 and 8515 is their ability to crystallize into an inactive phase from their melt. The film made from 8515 was fixed by heating the film above 80° C. The crystals of 8515 melt when the film is heated above 80° C. in an oven. The film was also be fixed by passing it through a heat laminator. The diacetylene crystallizes into an inactive phase when the film is cooled to room temperature. The fixed film can be left under the ambient light for months with little or no effect of incident white light. In the absence of the light, the film can be stored for years with very little development of additional color.

The thermally fixed film can provide sufficient archival image life. However, if required, the film can be further fixed by dipping in a nontoxic polar organic solvent, such as ethanol or tetrahydrofuran. The unreacted monomer molecules get extracted with tetrahydrofuran by dipping the film in the solvent for about five minutes at room temperature. The resultant fixed film is transparent and totally unaffected by UV light and temperature. The film can also be fixed by dipping it in ethanol for about five minutes at room temperature, However, this procedure makes the film opaque. The ethanol fixed film was made transparent by dipping in water for less than a minute at room temperature. Water dissolves/swells PEl/BA and upon drying the coating becomes transparent.

It is not necessary to heat a film containing a diacetylene to its melting point if it undergoes a phase change from active to inactive below its melting point.

In order to select the screen for 8515 film, thin foils of various thicknesses (0.01 mm to 1.6 mm) of some metals were tested as the top and bottom screens for megavolt radiations. As a top screen, most of the metals attenuate the megavolt beam and there is no significant amplification of the image. However, most of the heavy metals amplified the image when used as the bottom screen. Pieces (about $2 \times 2$ cm$^2$) of metal foils were mounted on a 0.2 mm thick Mylar ®. A piece of the diacetylene film was placed on the metal foils. The films were irradiated with 100 and 200 rads of 10 MeV X-ray and 12 MeV electrons. The optical density of the exposed areas were measured. The results are summarized in Table 4. The optimum effect was observed with about a one millimeter thick lead screen. A one millimeter thick lead screen amplifies the image by about two times. The amplification is lower for electrons.

TABLE 4

Increase in Optical Density of the 8515 Film by Screens of Different Metals of Varied Thicknesses. The Film was Irradiated with 200 Rads of 10 MeV X-ray and 12 MeV Electrons.

| Metal | Thickness (mm) | Optical Density X-ray | Optical Density Electron |
|---|---|---|---|
| None | — | 0.12 | 0.11 |
| Tin | 0.1 | 0.15 | 0.12 |
| Silver | 0.127 | 0.16 | 0.12 |
| Gold | 0.01 | 0.15 | 0.13 |
| Zinc | 0.25 | 0.15 | 0.12 |
| Ag:Pd (1:3) | 0.127 | 0.16 | 0.13 |
| Lead | 1.6 | 0.19 | 0.15 |
|  | 1.0 | 0.19 | 0.16 |
|  | 0.5 | 0.19 | 0.15 |
|  | 0.25 | 0.18 | 0.14 |
| Copper | 1.27 | 0.15 | 0.13 |
|  | 1.0 | 0.15 | 0.13 |
|  | 0.635 | 0.15 | 0.12 |
|  | 0.25 | 0.15 | 0.12 |
|  | 0.127 | 0.14 | 0.12 |
| Brass | 0.5 | 0.16 | 0.12 |
|  | 0.25 | 0.16 | 0.12 |
|  | 0.127 | 0.15 | 0.11 |
|  | 0.025 | 0.14 | 0.11 |

A $30 \times 45$ cm$^2$ cassette was made by using a 1.6 mm thick lead foil. The metal foil was bonded to a 5 mm thick section of Plexiglass ®. The same sized piece of Plexiglass ® was covered with 0.2 mm Mylar ® film (to protect the 8515 film from UV light) and was used as the top transparent lid of the cassette. The film was sandwiched between the lead foil and the top lid, and exposed in separate experiments to 10, 25, 75, 100, and 200 rads 10 MeV X-ray radiation. The film was exposed to the same dosages in a commercially available Kodak cassette. After the irradiation, visible spectra of the samples were recorded. The absorption at 584 nm for the films exposed in this cassette was essentially the same as that exposed with the Kodak cassette. The results indicate that a commercially available cassette for measuring X-ray radiation can be used.

The pieces of the 8515 film were irradiated with different dosages, from 5 to 1,000 rads of 10 MeV X-ray radiation. A piece of 2.5 centimeter thick Lucite ® was used as the build-up. The source to surface distance was 100 cm and the field size was varied from $10 \times 10$ cm$^2$ to $20 \times 20$ cm$^2$.

A typical set of visible spectra of the films irradiated with different dosages of X-ray radiation is shown in FIG. 3. The dose is indicated on each spectrum. The film develops a noticeable faint pink color at about 10 rads. The peak at 584 nm becomes two peaks at higher radiation doses.

A typical set of visible spectra of the fixed film prepared by heating the irradiated films in FIG. 3 is shown in FIG. 4. The film was fixed by heating it at 80° C. for 5 minutes in an oven. The appearance of the peak at 620 nm provides a purple color to the film at higher radiation dosages. The peak at 620 nm becomes dominant as the radiation dose increases and shifts towards higher wavelengths. Because of this shift, the fixed film develops a blue black color at higher radiation dosages.

The G value (number of monomer molecules polymerized per 100 eV of energy) was determined by irradiating 9010 at different dosages of fast neutrons, X-rays, and electrons followed by determination of the fraction of monomer polymerized by the extraction method. On order to determine $G_{(-m,O)}$, the plots of G-value versus dose were extrapolated back to zero dose. The $G_{(-m,O)}$ values are reported in Table 5. For a given dose, the G value is lowest for neutrons because neutrons do not interact with orbital electrons. Hence, neutrons are unable to initiate polymerization. However, the interaction of neutrons with hydrogen nuclei can produce protons which can initiate polymerization. Electrons and X-rays, including the secondary radiations, can interact with orbital electrons to initiate polymerization. The highest G-value for X-ray radiation indicates that more secondary, lower energy radiations are produced by X-rays than by electrons.

TABLE 5

| $G_{(-m, 0)}$ Values of 9010 for Neutrons, Electrons and X-rays. | | | |
|---|---|---|---|
| Radiation | Neutrons | Electrons | X-ray |
| Energy (MeV) | 20 | 12 | 10 |
| $G_{(-m, 0)}$ | $55 \times 10^3$ | $180 \times 10^3$ | $320 \times 10^3$ |

The G-value for the Fricke dosimeter is low, ca., 15.5. Hence, the radiation dose in kilorads is required for calibration of sources. The $G_{(-m,O)}$ value for 9010 is $320,000 \pm 50,000$ for X-rays. That is about two thousand times higher than Fricke dosimeter. Because of the significantly high G-value for diacetylenes, significantly lower radiation doses will be required. The results also indicate that because of the high G-value, diacetylenes offer a unique opportunity of developing an absolute dosimeter for the calibration of sources and films for quality control and verification made from the same tissue specimen.

A simple, fast, and accurate primary dosimeter can be developed using a proper diacetylene. In order to prevent any polymerization during storage, an inactive phase of a diacetylene, such as that of 144 can be selected. Before the diacetylene is irradiated, it should be crystallized into an active phase from a suitable solvent and dried. However, in order to avoid polymerization during drying, one can select a solvent which dissolves the diacetylene at a high temperature and precipitates/crystallizes it at room temperature. Solvents, such as a mixture of ethanol and water are desirable. Instead of drying the crystals, the wet crystals can be irradiated at different radiation dosages up to 1,000 rads. The polymer conversion (fraction of polymerized monomer) can be determined by heating the irradiated mixture at a high temperature to dissolve/extract unpolymerized monomer and then filtering out the polydiacetylene molecules. A simple Soxhlet extractor can be used for extraction of the unreacted monomer. G-values can then be determined by using the following equation:

$$G_{(-m)} = \frac{N \times C \times 100}{M \times 6.25 \times 10^{13} \times D}$$

Where, $G_{(-m)}$ is the G-value for polymerization of the monomer, N is Avogadro is number, C is fractional polymer conversion, M is molecular weight of monomer, and D is radiation dose in rad.

The process of calibration of the sources can be simplified by supplying small vials containing an inactive diacetylene dispersed in proper solvent(s). The user can heat the vial to dissolve the diacetylene and then cool to room temperature for crystallization into the active phase. After irradiation, the vial is heated again to dissolve both monomer and polymer, and the color intensity is determined. From the calibration plots one can quickly determine the dose.

This invention further provides a utility of the film, diacetylenes and other formulations, such as a human skin lotion made from diacetylenes. The film can be imaged with, and information can be recorded with radiation having energy from short wavelength (300 nm) UV light to X-ray therapy radiation (about 40 MeV). It can also be used for monitoring lower energy nuclear particles, such as thermal neutrons (e.g., 0.025 eV). The film can also be used for monitoring radiation dose. The film can also be used for a variety of applications, such as a dosimeter for radiation, monitoring processes, such as radiation therapy, curing of coating and cross-linking of plastics, for recording images and information, and as microfilm and radiography film. In each of the above utility applications, there are a number of other applications, for example, for radiation therapy, the film can be used for verification, imaging, field size coincidence, as a transmission check, measuring portal radiation and beam data acquisition (depth dose, field flatness, beam symmetry and dosimetry), and mapping/calibration of brachytherapy.

For certain applications, such as the precise beam localization in radiation therapy, a solution/dispersion of diacetylene in form of an emulsion, solution, skin lotion or cream can be used. For example, the lotion can be applied on the skin of the patient at the entrance and exit points of the beam. Upon irradiation, the exact location of the entrance and exit of the beam can be determined. Skin lotions/creams can be aqueous or alcoholic aqueous. The lotion can be emulsified or non-emulsified. The lotion may contain several additives. The lotion can be prepared as a fine dispersion or solution of diacetylenes in water or alcohol along with other ingredients, such as binders (e.g. starch, gums and cellulose derivatives), emulsifying agents (e.g., lecithin, esters of fatty acids) and other additives, such as mineral oil, cetyl alcohol, triethanolamine, and the like. There are several alternatives to the lotion. For example, a solution of diacetylenes containing all other required additives can be spray coated onto the body at the desired radiation sites.

Radiation sources are calibrated with a tissue equivalent ionization chamber immersed in a tissue equivalent liquid and the dose distribution/profile of the radiation field is prepared. The detection materials of absolute/primary dosimeters, such as calorimeters, ionization chambers, and Fricke (ferrous sulfate), and the secondary dosimeters, such as silicon diode and thermoluminescence materials of dosimeters (used for calibration of sources), and that of silver halide films (used for quality control and verification) are not tissue equivalent. Thus, it is desirable to have a primary dosimeter used for calibration of radiation sources and the films used for the quality control and assurance should be made from the same tissue equivalent material. The present device can be used as a primary/absolute dosimeter for calibration of sources and films for quality control and verification of the therapy made from the same class of materials.

As a dosimeter, the film offers the following major characteristics, benefits, and advantages over the other dosimeter devices available commercially: It is a small, simple, low cost, and light weight device. Any sized dosimeter film can be prepared which acts as a passive dosimeter and does not require electronic equipment and can be used as a dosimeter over a very wide radiation dose range, from 5 to 500 rads. Higher radiation doses also can be determined. As diacetylenes are organic compounds having a density of about $1.1 \pm 0.1$ gram/cc, the film will be tissue equivalent. The diacetylenic based formulations, such as a lotion or cream, and devices, such as films and labels, can be used for monitoring UV exposure, e.g., by sunbathers. By selecting diacetylenes and their mixtures having proper radiation reactivity, one can match the UV exposure for sun bathers. The diacetylene based formulations and devices will undergo either blue or red color change. The UV exposure can be estimated from a reference color chart.

Diacetylenes, such as 166 and their cocrystallized mixtures, which when exposed to UV light, turn red and when heated at about 80° C. turn blue/black and become fixed, and can be used for making a high speed printing paper. A paper coated with such a diacetylene composition can be printed using a mask at extremely high speed. Printing can be done with a UV lamp using a negative/mask or using a UV laser. When the paper is heated, e.g., by passing between heated rollers, it will turn red, blue or black color. The printing papers can be prepared by coating them with an ink, emulsion or solution of the diacetylene composition. Desired colors can be obtained by mixing proper diacetylenes in proper proportions.

Medical supplies are sterilized with gamma-ray, X-ray and electrons. The radiation dose required for the sterilization varies from a few hundred kilorads to a few megarads. (Mrads). The shelf life of whole blood and that of a wide variety of foods is extended by irradiating with low dosage (1–100 kilorads) gamma rays and electrons. Many coatings are cured by UV light and UV curable inks are widely used to avoid air pollution. The radiation dose for all these applications can be monitored using a diacetylene, such as 166. In contrast to other diacetylenes, the radiation dosage indicator made from a diacetylene, such as 166, can be fixed by heating.

In order to see the printing of electrical circuits, photoresists of a printed circuit board and/or computer chip can either contain inherently, or can be coated with a photosensitive dye. When the photoresist is exposed to UV light, the developed electrical circuit can be seen. As diacetylenes polymerize to colored polymer upon irradiation, a photoresist or a coating of diacetylene will produce a color image of the circuit.

An item, e.g., a paper or an article of commerce, printed or coated, wholly or partially, with a diacetylenic ink or paint, can be used for its identification. The properties of diacetylenes, such as development of color upon UV exposure, reversible and/or irreversible color change and/or fluorescence change upon heating, can be used to identify the coated item.

EXAMPLES

The following Examples are illustrative of carrying out the claimed invention but should not be construed as being limitations on the scope and spirit of this invention.

Example 1

Synthesis of 166, 2,4-Hexadiyn-1,6-bis(n-Hexylurethane), R—C≡C—C≡C—R, where R= —CH$_2$OCONH(CH$_2$)$_5$CH$_3$:

Into a 500 ml round-bottom flask equipped with a magnetic stirrer, a 125 ml addition funnel and a drying tube were placed a magnetic stirring bar, 19.6 gram of 2.4-hexadiyn-1,6-diol and 300 ml of dichloromethane. The mixture was stirred at ambient temperature for ten minutes to dissolve the diol. To this solution were added 0.178 gram of dibutyltin bis(2-ethylhexanoate) and 1.8 ml of triethylamine as catalysts. The mixture was stirred for another ten minutes and then a solution of 50.0 gram of n-hexyl isocyanate (98%, 0.385 mole) in 50 ml dichloromethane was added dropwise at 25° C. within half an hour. At the end of the addition, the mixture was stirred at 25° C. for two hours. The reaction was allowed to proceed for a few hours at RT (room temperature) and then 10 ml of methanol was added. The mixture was heated to about 50° C. and stirred for one hour, cooled to ambient temperature and filtered. The solvents were removed under vacuum to give 67.9 gram of solid. One recrystallization of the crude material yielded 49.6 gram of the title compound, 166. A second recrystallization from methanol gave 166 with a m.p. 84.5°–85.5° C.

Example 2

Synthesis of 9010 (A 90:10 Weight Percent mixture of 166:156) 166: R—C≡C—C≡C—R, where R= —CH$_2$OCONH(CH$_2$)$_5$CH$_3$. 156: R'—C≡C—C≡C—R", where R'= —CH$_2$OCONH(CH$_2$)$_4$CH$_3$ and R"= —CH$_2$OCONH(CH$_2$)$_5$CH$_3$ Into a five liter round bottom flask equipped with a stirrer were added 494 gram (4.5 mole) of 2,4-hexadiyn-1,6-diol and 1700 ml of anhydrous THF. The mixture was stirred in warm water bath (35° C.) to dissolve the diol. To the solution were added 4.5 gram of dibutyltin bis(2-ethyl hexanoate) and 45 ml of triethylamine. The solution was cooled to about 8° C. Then 53.9 gram (0.47 mole) of n-amyl isocyanate was added dropwise over 15 minutes. Temperature rose from 12° C. to 15° C. The mixture was stirred for additional 30 minutes at 15° C. 1196 gram of n-hexyl isocyanate (9.4 mole) was added dropwise over 75 minutes. During the addition the temperature was maintained between 15° and 25° C. with an ice-water bath. After half an hour the temperature of the reaction was raised to 50° C. The reaction was allowed to proceed for about half an hour and then 100 ml of methanol was added. THF was then removed under vacuum and the crude product was dissolved in hot isopropyl ether and filtered. The filtrate was cooled overnight at RT for crystallization of 9010. The crystals were filtered and air-dried to give 1490 gram (91.5% yield) of the title 9010 mixture, a solid, m.p. 82° C. to 84° C. The solid was recrystallized from five liters of isopropanol at −30° C. to yield 1370 gram of a solid, m.p. 84.5° C–85° C.

Example 3

Synthesis of 8515 (A 85:15 Weight Percent mixture of 166:156). 166: R—C≡C—C≡C—R, where R= —CH$_2$OCONH(CH$_2$)$_5$CH$_3$. 156: R'—C≡C—C≡C—R", where R'= —CH$_2$OCONH(CH$_2$)$_4$CH$_3$ and R"= —CH$_2$OCONH(CH$_2$)$_5$CH$_3$ Into a 5 liter round bottom flask equipped with a magnetic stirrer, thermometer, 1 liter addition funnel and a drying tube were placed 390 gram (3.54 mole) of 2,4-hexadiyn-1,6-diol and 7.1 gram of dibutyltin bis(2-ethylhexanoate). THF (1800 ml) was added and the mixture was stirred at RT to dissolve the diol and the tin catalyst. Triethylamine (35 ml) was then added with stirring at −10° C. n-Pentyl isocyanate (69.7g, 99%, 0.61 mole) was added over 10 minutes stirring. The mixture was cooled to 12° C. with an ice-water bath and 980 gram (99%, 7.63 mole) of n-hexyl isocyanate was added in a small stream over 55 minutes while the reaction temperature was maintained at 12° to 16° C. The resulting mixture was stirred at about 15° C. for 1 hour. The temperature of the reaction was then raised to about 50° C. The mixture was stirred for 30 minutes, cooled to 40° C. and methanol (100 ml) was added to destroy excess isocyanate which caused the temperature to rise to 50° C. The contents were cooled to 35° C. and then stirred for one hour. About 1500 ml of the solvent was removed with a rotary evaporator under vacuum and the residue was added to 4500 ml of isopropyl ether. The mixture was reheated to give a complete solution, cooled to RT and then placed in the refrigerator overnight for crystallization. The resulting crystals were filtered, and washed with 1000 ml of chilled isopropyl ether and then dried (crude weight 1240 g).

The solid was dissolved in 4.5 liter of hot isopropanol, filtered and the filtrate was cooled in a freezer (−30° C). The resulting crystals were filtered, washed with 1000 ml of cold isopropanol and dried to give 1020 gram. Another crystallization from isopropanol gave 908 gram of the title mixture, 8515.

Example 4

Synthesis of 9010-16PA (A 90:10 Weight Percent mixture of 166:16PA). 166: R—C≡C—C≡C—R, where R= —CH$_2$OCONH(CH$_2$)$_5$CH$_3$. 16PA: R'—C≡C—C≡C—R", where R'= —CH$_2$OCOCH$_2$C$_6$H$_5$ and R"= —CH$_2$OCONH(CH$_2$)$_5$CH$_3$ Into a 500 ml round bottomed flask was charged 27.5 gram of 2,4-hexadiyn-1,6-diol and 250 ml of THF. After stirring at ambient temperature, 19.8 gram of triethylamine was added. Then, phenyl acetyl chloride (7.9 gram) was added dropwise over about 5 minutes. Precipitation occurred during this addition, apparently due to the formation of triethylamine hydrochloride. Stirring at near ambient temperature was continued for several minutes. Then 64.6 gram of n-hexyl isocyanate was added dropwise over 15 minutes. The temperature of the reaction was maintained to about 20° C. with cold water. The resultant mixture was stirred for 10 more minutes, then heated up to 45° C.–50° C. for 20 minutes. Methanol (10 ml) was then added at 50° C. and allowed to cool to ambient temperature. The mixture was filtered and the residue washed with 10 ml methanol. The filtrate and washings were evaporated with a rotary evaporator under vacuum. The residual (viscous liquid) was added to 500 ml of isopropyl ether and the mixture heated to dissolve, cooled, and the resulting solid formed was refiltered (the solid was the amine hydrochloride). The filtrate was placed in a refrigerator for crystallization. The solid was filtered after a day to yield the above-titled mixture, 9010-16PA. The solid was highly reactive to UV light. A film was made using the procedure similar to that described in Example 21. The film partially polymerized to a red color when exposed to UV and x-rays. The radiation reactivity is similar to that 166. The film turned blue/purple when heated at 85° C. The heated film is highly inactive to UV light.

Example 5

Co-crystallization of Tricosa-10,12-diynoic acid (TC) and Pentacosa-10,12-diynoic acid (PC): Tricosa-10,12-diynoic acid [HOOC—(CH$_2$)$_8$—C≡C—C≡C—(CH$_2$)$_{10}$H], and Pentacosa-10,12-diynoic acid [HOOC—(CH$_2$)$_8$—C≡C—C≡C—(CH$_2$)$_{12}$H] were obtained from Farchan Laboratories, Inc. Following mixtures were prepared in test tubes, melted and thoroughly mixed. Each mixture was dissolved in 2 ml chloroform coated on filter paper strips by dip coating and exposed to short wavelength (254 nm) UV light. Table 6 summarizes the results:

TABLE 6

Radiation Reactivity of PC, TC and their Cocrystallized Mixtures.

| Name of Mixture | Wt. of TC (g) | Wt of PC (g) | TC % | PC % | m.p. (°C.) | Ultra-violet Reactivity |
|---|---|---|---|---|---|---|
| PC | 0.0 | 0.5 | 0 | 100 | 62.3 | Poor |
| TP14 | 0.1 | 0.4 | 20 | 80 | 55–58 | Fast |
| TP23 | 0.2 | 0.3 | 40 | 60 | 53 | Fast |
| TP32 | 0.3 | 0.2 | 60 | 40 | 50–52 | Fast |
| TP41 | 0.4 | 0.1 | 80 | 20 | 53 | Very Fast |
| TC | 0.5 | 0.0 | 100 | 0 | 54–56 | Poor |

Five percent solutions of TC, PC and TP41 were prepared in acetone. The diacetylenes were coated on filter papers by dip-coating and exposed to a short wavelength UV light (from Model UVG-11,254 nm lamp made UVP Inc., San Gabriel, Calif.) for a few seconds. Visible spectra of TC, PC and TP41 were recorded. The absorbance peak at 640 nm of TP41 was about 20 times higher than PC and about 5 times higher than TC. Film of TP41 was also similarly more reactive than PC and PC. When the films of TC, PC and TP41 are exposed to UV light, they develop blue color. The blue color intensifies with the dose. When the partially polymerized films are heated above the melting points of the diacetylenes, they undergo an irreversible blue-to-red color change. The films further undergo a reversible red-to-yellow color change when heated further near and above the melting points of the polydiacetylenes.

Example 6

Preparation of PEl/BA complex: To 250 grams of a warm solution of 30% PEl (Polyethyleneimine) solution in water (75.1 gram, 1.75 mole of PEl) was added 108 grams (1.75 mole) of boric acid under vigorous stirring. The boric acid complexed rapidly and completely to form a clear solution. In the absence of PEl, the solubility of boric acid is only about 5%. The coating of this solution provided a glass like highly transparent coating.

Example 7

Preparation of other complexes of PEl: Different organic and inorganic compounds, which can be used as convertors, were added to different concentrations of PEl solution. The mixtures were stirred and coated onto polyester film. Properties of the resulting films are summarized in Table 3 with some of the representative compounds.

Example 8

Plasticization of PEl/BA: To 10 ml of 15–30% solutions of PEl/BA were added different low molecular weight and polymeric plasticizers, such as dioctylphthalate, polyethylene glycol, polyethylene glycol distearate, polyethylene oxide, polyvinyl alcohol, gelatin, polyacrylamide, polyethyleneimine, polyvinylpyrrolidone, ammonium oleate, sodium oleate, dodecyl sulfate heptanoic acid, hexanoic acid, palmitic acid, oleic acid and propionic acid. The mixtures were thoroughly mixed and coated onto Mylar® and Cronar® films using a #20 wire wound rod. The coatings were allowed to dry either at RT or in an oven between 50° C. and 110° C. for half an hour. The films were then bent/creased sharply at 180° and then bent back to make the film flat by applying pressure along the creased line. The degree of plasticization was determined from the crazing of the coating. A good plasticizer should either prevent or minimize the crazing. Maximum prevention of the crazing was obtained with propionic and heptanoic acid, prevented the crazing. The following formulation provided a coating which did not crack or craze: 143 gram of 30% PEl, 43 gram of boric acid and 22 gram of propionic acid.

Example 9

Monitoring Alpha Particles: A 8515 film prepared according to Examples 21 and 22 was exposed to alpha particles from a commercially available antistatic source of 50 micro Curie polonium-210 for five minutes. Polonium-210 emits alpha particles of 4.5 MeV. The image of the source was obtained in red color. The results indicates that the film can be used for monitoring alpha particle therapy treatment. When boron-10 is irradiated with neutrons, it emits alpha particles.

Example 10

Substratum: To nine parts of 10% polyvinylacetate in ethanol:water (4:1) was added 1 part of 10% low molecular weight polyacrylic acid in ethanol. The molecular weight of the polyacrylic acid was 2,000. The mixture was coated onto a polyester (e.g., Mylar®) film and dried either at room temperature or in an oven at 80° C. The adhesion of the substratum coating with polyester and PEl/BA was tested by the cross-hatch test (ASTM method #D-3359). Under this method, the coating is cut crosswise with a very sharp, narrow blade knife with a distance of 2 mm between the cuts. One end of an adhesive tape was firmly applied on the cross-hatch. The tape was pulled from the other end. The tape did not lift the substratum.

Example 11

Complexes (solid solution) of inorganic compounds with gelatin: In order to use inorganic complexes or solid solutions of gelatin as binders, for radiation sensitive compounds, in the substratum, radiation sensitive coat, and top coat, to amplify images upon irradiation with high energy radiations, various amounts of different inorganic salts were added to 20 ml of 10% gelatin solution in water at about 45° C. The mixtures were coated onto a polyester film. The clarity and tackiness of the coatings were noted. The results are summarized below in Table 7 for some selected salts:

TABLE 7

Complexes/Solid Solutions of Gelatin with some Inorganic Compounds.

| Salts | Amount (g) | Results |
|---|---|---|
| Boric acid | 0.5 | Particles |
| $BaI_2$ | 0.3 | Clear, nontacky |
|  | 2.0 | Light yellow, transparent, nontacky |
|  | 4.0 | Light yellow, transparent, nontacky |
| NaI | 0.8 | Clear, nontacky |
|  | 1.8 | Light yellow, slightly tacky |
| $SnI_4$ | 0.3 | Light yellow, nontacky |
|  | 0.7 | Light yellow, particles, nontacky |
| $SnCl_4$ | 1.8 | Clear, nontacky |
|  | 1.8 | Clear, nontacky |
| $ZnCl_2$ | 1.3 | Clear, nontacky |
|  | 4.2 | Clear, slightly tacky |
| $ZnBr_2$ | 1.0 | Clear, nontacky |
|  | 3.5 | Clear, slightly tacky |
| $ZnI_2$ | 0.5 | Clear, nontacky |
|  | 0.9 | Slightly turbid |
| $ZnSO_4$ | 0.5 | Clear, nontacky |
|  | 1.1 | translucent |

Example 12

Complexes (solid solutions) of inorganic compounds with polyacrylic acid: To 5 ml of 17.5% solutions of polyacrylic acid (mol. wt. 90,000) were added 0.3 and 0.6 gram of potassium iodide and 0.4 gram of magnesium acetate. The solutions were coated onto a polyester film. The coating containing 0.3 gram of potassium iodide was clear while that containing 0.6 gram became translucent. The coating containing 0.4 gram of magnesium acetate resulted in a transparent coating.

Example 13

Mixtures of fine powders of inorganic materials: About 3 ml of different aqueous polymer solutions were placed in a test tube and 1.5 to 2 ml portions of 40% colloidal silica ($SiO_2$, pH-9) were added and mixed. The mixtures were coated on a polyester film. The results are summarized below in Table 8.

TABLE 8

Dispersion Of $SiO_2$ in some Binders.

| Polymer | Conc. | Colloidal $SiO_2$ | Property of the coating |
|---|---|---|---|
| None | — | — | Clear but brittle coating |
| PEO | 3 ml 5% | 1.5 ml | Clear transparent coating |
| PEI | 3 ml 30% | 2.0 ml | Thick gel, not coated |
| PEI/BA | 3 ml 15% | 1.5 ml | White precipitate |
| PVP | 3 ml 10% | 1.5 ml | Thick gel, PVP precipitates. |
| PVP | 15 ml 0.7% | 0.7 ml | Clear coating |
| PAA | 3 ml 25% | 2.0 ml | White precipitate |

Example 14

Formation of emulsion without any binder: Into a jacketed blender container were added 40 gram of water and two drops of GAF-710 and mixed at low speed. To the mixture was added 12 ml of a 100% (6 gram in 6 ml) solution of 9010 in MEK and homogenized for two minutes at 60° C. The white emulsion formed was poured into (1) liquid nitrogen and (2) into a test tube at RT. The parts of the sample frozen at liquid nitrogen were brought to RT, 8° C., and −20° C. and maintained for a day. The low temperature samples were then brought to room temperature.

The emulsion which was quenched to RT in the test tube was essentially inactive to UV radiation but became active within an hour. The sample which was quenched to liquid nitrogen and brought to RT became UV active almost immediately. The samples stored at 8° and −20° C. were also active. The sample quenched to RT had flat platelet type crystals while those quenched into liquid nitrogen had globule type crystals.

Two grams of the above emulsions were mixed with 2 gram of aqueous solutions of (1) 30% PEI/BA and (2) 10% polyvinylpyrrolidone, mixed and coated onto Mylar ® film using a #30 wire wound rod. Both coatings were transparent and UV active.

Two grams of the above emulsion was mixed with two grams of vinylacetate latex (obtained from Monomer-Polymer & Dajac Laboratories, Inc., Trevose, Pa.). and coated onto polyester film. The coating was UV active.

Part of the above emulsion was freeze dried under vacuum. The dried crystals were dispersed in a 20% solution of poly(iso-butylmethacrylate) in cyclohexane at room temperature and coated onto a plastic film. The coating was substantially transparent and UV reactive.

Example 15

Totally aqueous emulsions without binder: Into a jacketed blender container was weighed 75 gram of water, 4 drops of Gafac-710 and 7.5 gram of 9010. The temperature of the mixture was raised to about 95° C. by circulating hot water while homogenizing at high speed. The mixture was homogenized for two minutes and then half of the emulsion was poured into liquid nitrogen while the other half was poured in to a petri-disc at room temperature. Both the samples were allowed to come to room temperature.

5 gram of the emulsions were mixed with 30% PEI/BA solution and coated onto polyester film. The coatings were not reactive to UV light because 9010 crystallizes into an inactive phase from its melt. When 4BCMU was used instead of 9010, the coating became UV active because 4BCMU crystallizes into an UV active phase from its melt.

Example 16

Emulsion without using any solvent: 50 gram of polyethylene glycol, molecular weight, 14,000, was added into a jacketed container of a blender. Hot water (95° C.) was circulated to melt polyethylene glycol. 5 gram of 9010 was added which dissolved in the molten polyethylene glycol. The mixture was homogenized for two minutes at high speed and poured into liquid nitrogen. The solid was allowed to come to room temperature. 5 gram of the solid emulsion was added into 10 ml of water to dissolve polyethylene glycol and the dispersion was coated onto a polyester film. The resulting coating was translucent and UV reactive.

Example 17

Mixture of an emulsion and a latex: A 20 ml 15% (w/v) solution of 9010 in toluene was emulsified with 10 ml of water in the presence of 0.2 ml of an emulsifier (e.g., Gafac RS-710) using a high speed blender/homogenizer for five minutes. The temperature was maintained below 30° C. by circulating cold water. A milky white emulsion was obtained. The emulsion was stable for months at RT without causing precipitation of 9010 or a phase separation. The emulsion was not active to UV light. The emulsion was then mixed with 20 ml of a vinyl acetate latex (obtained from Monomer-Polymer & Dajac Laboratories, Inc., Trevose, Pa.). The vinyl acetate (PVA) latex contained 50% PVA. The mixture of the latex and the emulsion was then coated onto Mylar ® at 30 and 90 microns wet thicknesses and dried at ambient temperature. The coating was transparent and UV reactive.

The emulsion of 9010 was also mixed with several other polymer latexes, such as those of vinyl chloride, ethylene/vinylacetate, vinyl chloride/methyl acrylate, ethylene, 2-vinylpyridine, vinylpyrrolidone/styrene and styrene. The mixtures were then coated on a polyester film.

Example 18

Nonaqueous emulsions: Into a jacketed blender container was weighed 50 gram of 10% (w/v) poly(isobutyl methacrylate) in cyclohexane. Stirring at a low speed, 2.5 gram of 9010 was added. The temperature of the mixture was raised to about 55° C. to dissolve 9010 by circulating hot water. While homogenizing at high speed, the temperature of the mixture was lowered to 10° C. by circulating cold water. After 5 minutes, the mixture was transferred into a beaker. The solution was coated onto Mylar after half an hour. The coating had fine long needle type crystals of 9010 and was UV reactive.

The above experiment was repeated by adding solution of 9010 in acetone (2.5 gram of 9010 dissolved in 1 ml of acetone) in 50 gram of 10% (w/v) poly(isobutyl methacrylate) in cyclohexane. This coating also had long needle type crystals and was more UV reactive than the above coating.

Example 19

Semi-aqueous System: Into a jacketed blender container was weighed 50 gram of 30% (w/v) poly(vinylacetate) solution in 8:2 ethanol:water. While stirring at a low speed, 6 gram of 9010 was added. The temperature of the mixture was raised to about 55° C. to dissolve 9010 by circulating hot water. While homogenizing at high speed, the temperature of the mixture was lowered to 15° C. by circulating cold water. After 5 minutes, the mixture was transferred into a beaker. The solution was coated onto polyester film after half an hour. The coating had fine long needle type crystals of 9010 and was UV reactive. The mixture poured into liquid nitrogen had smaller needles.

Example 20

Formation of emulsion using a solvent which is highly soluble in water: To 40 grams of a 22.5% PEl/BA solution in a jacketed container of a high speed homogenizer was added 0.1 ml (about 6–8 drops) of the GAF-710 as an emulsifying agent. The mixture was homogenized for about a minute while circulating cold water. To the homogenized solution was added 12 ml of a 15% solution of 166 in methanol within about 5–10 seconds and the mixture was stirred at high speed for 3–5 minutes. The temperature of mixture was maintained below 30° C. The resultant emulsion was poured into a beaker and allowed to age at 25° C. for different periods of time and then coated onto polyester film. The freshly coated emulsion was almost inactive. The UV reactivity increased upon aging for the first few days and achieved maximum reactivity after about 3 days. Examination of crystals of the coating under an optical microscope indicates that only a small fraction of the crystals appeared to form during aging, while most of them became activated upon aging. The crystals were very fine needles and the coating was transparent.

Example 21

Preparation of An Emulsion of 8515 for Large Scale Coating: The stock solutions for making the emulsion were prepared as follows:

SOLUTION OF PEl/BA/OLEIC ACID: A 1:1 molar complex of PEl/BA (polyethyleneimine/boric acid) was prepared by dissolving 1948 gram of boric acid in 4622 gram of a 30% (w/w) solution of PEl (Aceto Corporation, Lake Success, N.Y.). The complex was diluted with 1540 ml of water. To this solution was added 81 gram of oleic acid dropwise while stirring vigorously. This solution was further diluted with 1365 ml of water.

SOLUTION OF 8515: 666 gram of 8515 was dissolved in 487 gram of methylethylketone at 70° C. and a small quantity of polymer was removed by filtration.

PREPARATION OF THE EMULSION: Into a four liter stainless beaker was added 1050 gram of the above stock solution of PEl/BA/Oleic and heated to 60° C. To the solution was added 385 gram of the 8515 solution and homogenized with a high speed mechanical stirrer for five minutes. Evaporation of the solvents was minimized by covering the container with a plastic film. A creamy emulsion was obtained. The emulsion was poured into about five liters of liquid nitrogen while stirring with a mechanical stirrer. The mechanical stirrer converted the solidified emulsion into a powder. Using the above procedure, two more batches of frozen emulsion were prepared. All three batches were mixed.

The solid emulsion was spread into nine aluminum trays (60×30×3 cm$^3$) trays and placed in a water bath at 20° C. The solid emulsion thawed within a few minutes. Some liquid oozed on the surface. After about ten minutes, oozed liquid (which was mainly water) was decanted off. The emulsion was left in the trays for about half an hour and then stored at room temperature under a hood. Only for this pilot plant batch, most of the solvents, especially MEK were allowed to evaporate for about five hours and then transferred into a plastic jar and diluted with water to obtained 800 cP viscosity.

The emulsion was coated on Mylar ® using #30 a wire wound rod and was allowed to dry at room temperature. The coating was transparent and highly reactive to UV light.

Example 22

Making of the film on a large scale: The emulsion prepared according to the above Example 21 was coated onto a 100 micron thick, 30 cm wide piece of Cronar ® using the reverse roll gravure technique using a pilot plant coater. The emulsion of 8515 was pumped into the boat in which the gravure bar rotated in the opposite direction of the film. A doctor's blade removed excess emulsion from the bar. The polyester film was lowered to contact the gravure bar. The emulsion became coated on the film and slowly moved into the oven where it was dried and wound on take-up roll. The film was then coated on the back side under the identical conditions. Using the gelatin solution, PEl/BA/8515 coating was top coated with gelatin first on one side and then on the other. The gelatin concentration was 10% and the gravure rod used was a #110. Other drying and coating conditions for the gelatin top coatings were identical to that of the diacetylene coat. Because of the shorter drying path, higher oven temperatures (e.g., 50° C.) were used for drying the coatings. The coating parameters, used for making the transparent film of 8515, are as follows:

WEB/FILM: 12" wide, 0.1 mm thick Cronar ® film.
VISCOSITY OF THE EMULSION: 700 cP.
COATING RODS: 20 mm diameter, #60 (60 cells/inch) helical gravure
COATING ROD SPEED: 36 rpm
COATING TECHNIQUE: Reverse roll gravure
WEB SPEED: 1.3 meter/minute
DRYING PATH: Total 24 feet, 7 feet before oven, 17 feet in oven.
DRYING TEMPERATURES: Three zones, (First: 40° C.; Second: 45° C., and Third: 50° C.).
THICKNESS OF PEl/BA/8515: 15 microns.
THICKNESS OF SUPERCOAT/GELATIN: 3 microns.
TRANSPARENCY: 70%

Example 23

Spatial Resolution: In order to determine spatial resolution of the film, a resolution target (USAF 1951 Target Neg., Product #70.6035, Made by Rolyn Optics Company, Covina, Calif.) was used. A UV lamp (4 watt tube lamp, Model UVG-11 of UVP Inc., San Gabriel, Calif.) covered with a metal foil having 3 mm hole was used to irradiate the film. The film of Example 22 coated on one side was placed in contact with the resolution target, the coating facing the target, and exposed to short wavelength UV light from a distance of 20 cm for a few days. Though most of the UV light was absorbed by the glass some light did penetrate through. A pattern of the target was obtained. All elements of Group 7 were resolved which corresponds to more than at least 200 lines per millimeter. When the film was fixed by heating at 80° C., there was very little loss of resolution.

Example 24

Beam Imaging and Dose mapping: In order to determine the radiation dose mapping (beam data acquisition, e.g., across-beam-dose and depth-dose profiles) large pieces (about 30×45 cm$^2$) of pieces of film of Example 22 were placed parallel and perpendicular to the beams of 10 MeV X-ray radiation, 18 and 12 MeV electrons and 15 MeV neutrons. The images of the beams were obtained. The penetration of electrons was the lowest. Neutrons and X-rays penetrated significantly deeper.

Example 25

Image of Body Phantoms: In order to demonstrate that the film can be used as a verification film, (1) a skull phantom was placed on the film of Example 22 and irradiated with 200 rads of 20 MeV neutrons without using any build-up device and (2) skull and palm phantoms were placed onto the films and irradiated with 200 rads of 10 MeV x-rays. In the case of the X-ray irradiation, the film was loaded in a Kodak cassette. The image of the phantom was very weak in the case of neutrons mainly because of the lesser sensitivity of the film. However, a reasonably good image was obtained with X-ray radiation. Some features of the anatomy were noticeable in the case of the skull phantom irradiated with 10 MeV x-rays.

Example 26

Figure 5:
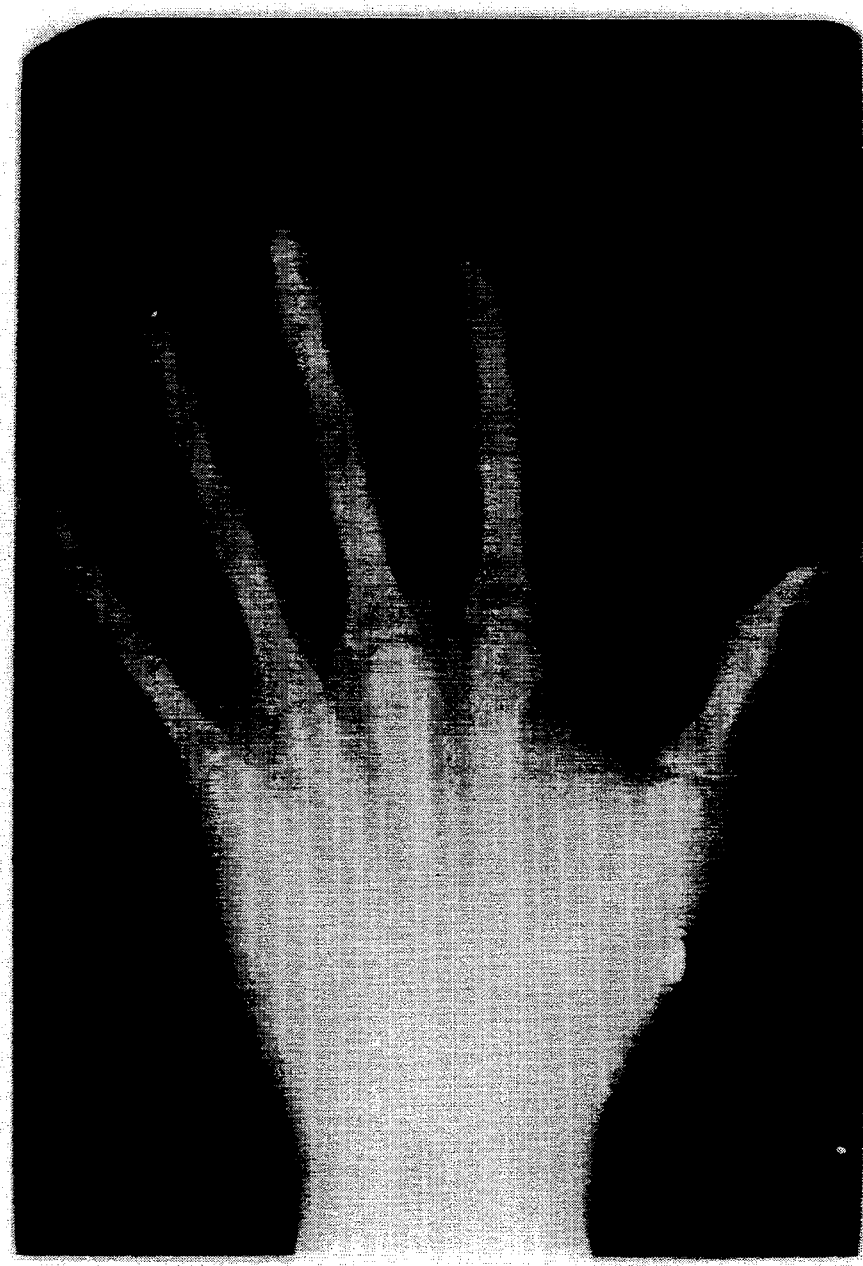
FIG. 5. An X-ray photograph, using the 8515 film, of a hand phantom taken at 200 rads of 100 KeV X-rays.

Image of phantom with diagnostic X-ray: A hand phantom was placed adjacent to the film of Example 22 and irradiated with 200 rads of 100 KVp x-rays. FIG. 5 shows a black and white photograph of the image obtained on the film (the areas receiving higher dose, e.g., tissues, were red in color while those receiving lower dose, e.g., bones, were white to faint pink). The image of the phantom is very sharp. The film used in this example had no convertor in the under coat, radiation sensitive coat or top coat for diagnostic X-ray exposure. Hence it required a much higher radiation dose for imaging. As shown in Examples 28–31, the X-ray dose required to obtain the image can be reduced by about a few orders of magnitude by using convertors in the undercoat, radiation sensitive coat and/or top coat. Selection of proper convertors, their concentrations and other experimental conditions can further reduce the dose required for imaging with diagnostic x-rays to a fraction of a rad.

Example 27

G-VALUE OF 9010: About 4 grams of 9010, crystallized from isopropanol, was sealed separately in several black plastic bags and irradiated with different dosages, 25–5,000 rads of 20 MeV neutrons, 12 MeV electrons and 10 MeV x-rays. The unreacted diacetylene in each sample was extracted with isopropanol using a soxhlet extractor and the amount of polydiacetylene formed, and hence percent conversion to polymer, was determined by weighing the extraction thimble before and after extraction. X-ray radiation is the most effective in inducing polymerization while neutrons are the least. The G-value, (number of chemical events, in the present case number of monomer molecules polymerized, per 100 eV of energy deposited), was determined using the following equation:

$$G(-m) = \frac{N \times C}{M \times D \times 6.25 \times 10^{11}}$$

Where, $G_{(-m)}$ is the G-value for polymerization of the monomer, N is Avogadro number, C is fractional polymer conversion, M is molecular weight of monomer, and D is dose in rad.

The G value at zero radiation dose, $G_{(-m,0)}$, was determined by extrapolating plots of G-value versus radiation dose to zero dose. The values are reported in Table 5.

Example 28

Effect of convertors in the radiation sensitive coat on the amplification of the image: To a 15 gram emulsion of PEl/BA/9010 prepared according to the procedure similar to that described in Example 21 were added 0.5 gram different inorganic compounds listed below. The mixtures were stirred to dissolve the salts. The emulsion-mixtures were then coated onto Mylar ® with a #30 wire wound rod. The coatings were allowed to dry at room temperature and then irradiated with 254 nm UV, 60 rads of 60 KVP x-rays, 100 rads of 10 MeV x-rays and 12 MeV electrons. The optical density of the coatings were measured before and after the irradiation. The results are summarized in the following Table 9:

TABLE 9

Optical Density of Film containing different Convertors in the Radiation Sensitive Coat.

| Convertor | Radiation: Energy: Dose (rads): | None | X-ray 60 KVP 60 | X-ray 10 MEV 100 | Electrons 12 MeV 100 |
|---|---|---|---|---|---|
| None | | 0.05 | 0.14 | 0.08 | 0.08 |
| $BaI_2$ | | 0.07 | 0.30 | 0.12 | 0.11 |
| $BaSO_4$ | | 0.06 | 0.26 | 0.11 | 0.10 |
| $BaBr_2$ | | 0.06 | 0.36 | 0.10 | 0.09 |
| $BaCl_2$ | | 0.06 | 0.32 | 0.10 | 0.10 |
| $PbI_2$ | | 0.05 | 0.43 | 0.09 | 0.09 |
| $MgCl_2$ | | 0.05 | 0.23 | 0.08 | 0.07 |
| KI | | 0.05 | 0.38 | 0.08 | 0.08 |
| KBr | | 0.05 | 0.34 | 0.09 | 0.07 |
| NaI | | 0.05 | 0.38 | 0.08 | 0.07 |
| $NaPO_4$ | | 0.05 | 0.16 | 0.09 | 0.08 |
| $SnI_4$ | | 0.05 | 0.33 | 0.08 | 0.07 |
| $H_2WO_4$ | | 0.05 | 0.36 | 0.08 | 0.08 |
| ZnO | | 0.10 | 0.36 | 0.19 | 0.19 |
| $ZnBr_2$ | | 0.06 | 0.37 | 0.10 | 0.09 |
| ZnI | | 0.05 | 0.34 | 0.09 | 0.8 |
| $ZnSO_4$ | | 0.05 | 0.25 | 0.08 | 0.08 |
| CsBr | | 0.05 | 0.36 | 0.07 | 0.07 |
| CsI | | 0.05 | 0.38 | 0.08 | 0.07 |

Example 29

Effect of metal convertors on the amplification of the image; polymer/metal complex added into the emulsion: To 10 gram of the PEl/BA/9010 emulsion prepared according to the procedure similar to that described in Example 21 were added 10 gram samples of different metal complexes of PEl listed below:

PEl/Metal complexes:
15% $BaBr_2$ in 30% PEl
10% $BaI_2$ in 30% PEl
5% CsBr in 7.5% PEl
4% CsI in 7.5% PEl
9% $PbI_2$ in 10% PEl
26% $ZnI_2$ in 30% PEl
2% ZnO in 30% PEl
25% $ZnSO_4$ in 20% PEl The mixtures of emulsion-complex were mixed and then coated onto Mylar ® with 1 #30 wire wound rod. The coatings were allowed to dry at room temperature and then separately irradiated with 254 nm UV, 60 rads of 60 KVP x-rays, 100 rads of 10 MeV x-rays and 12 MeV electrons. The optical density of the coatings were measured before and after the exposure. The results are summarized in the following Table 10:

TABLE 10

Optical Density of Film containing different Convertors in the Radiation Sensitive Coat.

| Convertor | Radiation: Energy: Dose (rads): | None | X-ray 60 KVP 60 | X-ray 10 MEV 100 | Electrons 12 MeV 100 |
|---|---|---|---|---|---|
| None | | 0.05 | 0.14 | 0.08 | 0.08 |
| $BaI_2$ | | 0.14 | 0.58 | 0.18 | 0.18 |
| $BaBr_2$ | | 0.04 | 0.21 | 0.05 | 0.06 |
| $PbI_2$ | | 0.03 | 0.30 | 0.06 | 0.06 |
| ZnO | | 0.04 | 0.12 | 0.05 | 0.06 |
| ZnI | | 0.04 | 0.34 | 0.06 | 0.06 |
| $ZnSO_4$ | | 0.03 | 0.19 | 0.06 | 0.05 |
| CsBr | | 0.03 | 0.27 | 0.06 | 0.05 |
| CsI | | 0.03 | 0.27 | 0.06 | 0.05 |

Example 30

Effect of convertor in the top coat: The single side coated 8515 film of Example 22 was coated with a #30 wire wound rod using the following solutions:
15% $BaBr_2$ in 30% PEl
10% $BaI_2$ in 30% PEl
5% CsBr in 7.5% PEl
4% CsI in 7.5% PEl
9% $PbI_2$ in 10% PEl
26% $ZnI_2$ in 30% PEl
2% ZnO in 30% PEl
25% $ZnSO_4$ in 20% PEl The coatings were dried at room temperature and were separately irradiated with 60 rads of 60 KVP x-rays, 100 rads of 10 MeV x-rays and 100 rads of 12 MeV electrons, Optical density measurements were taken before and after the exposure. The results are summarized Table 11:

TABLE 11

Optical Density of Film containing different Convertors in the Top Coat.

| Convertor | Radiation: Energy: Dose (rads): | None | X-ray 60 KVP 60 | X-ray 10 MEV 100 | Electrons 12 MeV 100 |
|---|---|---|---|---|---|
| None | | 0.04 | 0.13 | 0.08 | 0.08 |
| PEl/BA | | 0.10 | 0.31 | 0.14 | 0.13 |
| PEl/$BaI_2$ | | 0.09 | 0.45 | 0.12 | 0.10 |
| PEl/$BaBr_2$ | | 0.09 | 0.29 | 0.11 | 0.10 |
| PEl/CsBr | | 0.09 | 0.54 | 0.12 | 0.10 |
| PEl/CsI | | 0.09 | 0.55 | 0.12 | 0.11 |
| PEl/$PbI_2$ | | 0.09 | 0.67 | 0.12 | 0.11 |
| PEl/$ZnI_2$ | | 0.09 | 0.55 | 0.13 | 0.11 |
| PEl/ZnO | | 0.08 | 0.30 | 0.10 | 0.09 |
| PEl/$ZnSO_4$ | | 0.09 | 0.44 | 0.13 | 0.12 |

Example 31

Effect of convertor in the undercoat coat: A polyester film was coated with the following complexes using a #30 wire wound rod:
10% $BaI_2$ in 30% PEl
9% $PbI_2$ in 10% PEl
26% $ZnI_2$ in 30% PEl
25% $ZnSO_4$ in 20% PEl The coatings were dried in an oven at 60° C. for an hour. The films were then coated with the emulsion described in Example 21 using a #30 wire wound rod. The pieces of the films were irradiated with 60 rads of 60 KVP x-rays, 100 rads of 10 MeV x-rays, and 100 rads of 12 MeV electrons. Optical density measurements were taken before and after the exposure. The results are summarized below in Table 12:

TABLE 12

Optical Density of Film containing different Convertors in the Under Coat.

| Convertor | Radiation: Energy: Dose (rads): | None | X-ray 60 KVP 60 | X-ray 10 MEV 100 | Electrons 12 MeV 100 |
|---|---|---|---|---|---|
| None | | 0.05 | 0.14 | 0.08 | 0.08 |
| PEl/$BaI_2$ | | 0.09 | 0.42 | 0.11 | 0.10 |
| PEl/$PbI_2$ | | 0.07 | 0.61 | 0.11 | 0.11 |
| PEl/$ZnSO_4$ | | 0.07 | 0.47 | 0.12 | 0.11 |

Example 32

Imaging with a UV laser: A piece of film of Example 22 was exposed to a 256 nm Krypton fluoride laser. The beam had diameter of one micron. Parallel lines and different shapes were drawn with the laser. The lines and the shapes were clearly visible as dark red lines under a microscope. The film was fixed by heating at 85° C. for 5 minutes. The images turned dark blue/black. The results show that the film can be used for writing information and printing images with a UV laser.

Example 33

Nondestructive testing of Industrial Parts: A piece of welded pipe was place on a piece of the film of Example 22. The assembly was irradiated with gamma rays from iridium for 20 minutes. A red image of the pipe with lighter image of the welding was obtained. Thus, welding seams and irregularities or flaws in the welds can be detected by the film of this invention.

Example 34

Inks, printing and color changes: Inks of 166 and TP41 were prepared by homogenizing 6 ml of 50% solutions of the diacetylene in methylethylketone in a commercially available raw ink (ink without pigment), Joncryl 142 (a water based ink of Johnson Wax, Racine, Wis.). The inks were milky white emulsions, Some papers were printed using the screen printing technique by squeezing the inks of this Example and that of Example 21, through a screen. Colorless/white images of the screen were obtained. When exposed to 254 nm UV light, the images became visible in colors; 166 in red color and TP41 in blue color. When heated with a hot air blower, the red color of 166 changed to blue color and the blue color of TP41 became red. Upon further heating to a higher temperature, the red color of TP41 became yellow and that of 166 became red. When cooled to room temperature, TP41 turned red and 166 turned blue. The images were irradiated again with the UV light. The TP41 image became purple-blue while that of 166 did not develop any color. Upon the second heating, the TP41 image changed to red color at lower temperature and yellow at a higher temperature. These types of inks can be used as "security inks" in printing, e.g., documents, to establish their genuineness and authenticity.

We claim:

1. A self-developing film for developing an image from exposure to X-ray, gamma ray, or electron, radiation comprising at least one conjugated diacetylene, or cocrystallized mixture thereof, capable of undergoing a color change upon polymerization when contacted with ultraviolet light, X-rays, alpha particles, or electrons, thereby forming an image; a binder; a convertor, wherein said convertor is a material which can emit lower energy radiation for polymerization of said diacetylene after contact with X-radiation, gamma radiation or electrons; wherein said image is capable of being fixed by heating said diacetylene at or above its melting point, or at the temperature at which the diacetylene undergoes a phase change to a radiation inactive phase, and wherein said film is transparent.

2. The film of claim I further comprising:
   (a) at least one layer containing said at least one conjugated diacetylene, or cocrystallized mixture thereof, capable of undergoing a color change upon polymerization induced by ultraviolet light, X-rays, alpha particles, or electrons, thereby forming a colored image;
   (b) at least one layer containing said binder and said convertor being in combination, being a complex or solid solution, wherein said convertor is a material capable of emitting ultraviolet light, low energy X-rays, alpha particles, or electrons upon contact with higher energy X-ray, gamma ray, electron, radiation;
   (c) a substrate upon which said layers (a) and (b) are deposited thereon, wherein layer (a) and layer (b) are capable of being combined into one layer (ab), and said colored image is capable of being fixed by heating said diacetylene at or above its melting point, or at the temperature at which the diacetylene undergoes a phase change to a radiation inactive phase.

3. The film of claim 1 wherein said diacetylene is selected from the group consisting of: 2,4-hexadiyn-1,6-bis (n-hexylurethane); 2,4-hexadiyn-1,6-bis (n-pentylurethane); 2,4-hexadiyn-1-mono (n-pentyl-urethane)-6-mono (n-hexylurethane); 2,4-hexadiyn-1-mono (n-hexyl-urethane)-6-mono (phenyl acetate); and co-crystallized mixtures thereof.

4. The film of claim 3 wherein said diacetylene is a co-crystallized mixture of 2,4-hexadiyn-1,6-bis (n-hexylurethane) and 2,4-hexadiyn-1-mono (n-pentyl-urethane)-6-mono (n-hexylurethane).

5. The film of claim 4 wherein said 2,4-hexadiyn-1,6-bis (n-hexylurethane) is present in the co-crystallized mixture in an amount of about 80 weight percent or above.

6. The film of claim 3 wherein said diacetylene turns red upon irradiation.

7. The film of claim 6 wherein said diacetylene after irradiation turns blue by heating at or above its melting point.

8. The film of claim 1 wherein said convertor is selected from the group consisting of an element, alloy, salt, of mixture thereof of barium or lead.

9. The film of claim 1 wherein the convertor is a metallic moiety covalently or ionically bonded to at least one of said diacetylenes.

10. The film of claim 1 wherein the convertor is a radio/electron luminescence or fluorescence phosphor which emits UV light, or lower energy X-ray or electrons when contacted with high energy X-rays, gamma rays, or electrons.

11. The film of claim I wherein the convertor is a metallic moiety intermixed with said binder in a complex or solid solution combination.

12. The film of claim I wherein said convertor is selected from salts, alloys, or mixtures of: Cr, Mn, Fe, Co, Ni, Zr, Ru, In, Sb, W, Bi, U, La, Cr, Zn, Mo, Ba, Pd, Ag, Cu, Pt, Pb, Au, Hg, Ti, Cd, K, Mg, Na, Sn, Cs, l; phosphors; fluorescent compounds; or cathode luminescent compounds.

13. The film of claim 9 wherein said convertor is selected from the group consisting of $BaI_2$, $BaSO_4$, $BaBr_2$, $BaCl_2$, $PbI_2$, $MgCl_2$, $KI$, $KBr$, $NaI$, $Na_3PO_4$, $SnI_4$, $H_2WO_4$, $ZnO$, $ZnBr_2$, $ZnI_2$, $ZnSO_4$, $CsBr$, $CsI$, $ZnS$, $ZnCl_2$, $Y_2O_2S$, $CaWO_3$ and $ZnSiO_4$.

14. The film of claim 1 wherein said convertor emits a lower energy radiation of 4 e V or above.

15. The film of claim 1 wherein said convertor is selected from lead iodide, barium iodide, or mixtures thereof.

16. The film of claim 1 wherein said binder is a water soluble or water-insoluble polymer.

17. The film of claim 9 wherein said binder is a water soluble binder selected from the group consisting of: polyacids, polyamines, polyethers, polyalcohols, polyamides, and gelatin.

18. The film of claim 17 wherein said binder is selected from the group consisting of polyacrylic acid, polyvinylalcohol, polyvinylpyridine, polyvinylpyrrolidone, polyethyleneimine, polyethyleneoxide, polyvinylether, and gelatin.

19. The film of claim 18 wherein said binder is polyethyleneimine.

20. The film of claim 1 wherein said binder forms a complex with said convertor.

21. The film of claim 1 further comprising (c) an undercoat layer.

22. The film of claim 1 wherein said diacetylene is a co-crystallized mixture of 2,4-hexadiyn-1,6-bis (n-hexylurethane) and 2,4-hexadiyn-1-mono (n-pentylurethane)-6-mono (n-hexylurethane) in an 85:15 weight ratio, respectively, said binder is polyethyleneimine complexed with the convertors and barium iodide.

23. The film of claim 1 wherein said diacetylene is in radiation active form.

24. The film of claim 1 wherein said diacetylene is in a radiation inactive form but is capable of being converted to the radiation active form prior to use.

25. A film of claim 1 wherein said resulting image can be further amplified or darkened by contacting with a dye which bonds with the polymerized diacetylene.

26. A self-developing film for developing an image from exposure to ultraviolet laser radiation comprising at least one conjugated diacetylene, or cocrystallized mixture thereof, capable of undergoing a color change upon polymerization when contacted with ultraviolet laser radiation thereby forming an image, and a polyethyleneimine binder complex, forming a transparent film, wherein said image is capable of being fixed by heating said diacetylene at or above its melting point, or at the temperature at which the diacetylene undergoes a phase change to a radiation inactive phase.

* * * * *